(12) United States Patent
Suzuki et al.

(10) Patent No.: US 7,982,212 B2
(45) Date of Patent: Jul. 19, 2011

(54) COPOLYMER AND POLYMER LIGHT EMITTING DEVICE USING THE SAME

(75) Inventors: Tomoyuki Suzuki, Tokyo (JP); Takanobu Noguchi, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 459 days.

(21) Appl. No.: 12/067,959

(22) PCT Filed: Oct. 3, 2006

(86) PCT No.: PCT/JP2006/020156
§ 371 (c)(1), (2), (4) Date: Mar. 25, 2008

(87) PCT Pub. No.: WO2007/043495
PCT Pub. Date: Apr. 19, 2007

(65) Prior Publication Data
US 2010/0176376 A1    Jul. 15, 2010

(30) Foreign Application Priority Data

Oct. 7, 2005    (JP) .............................. 2005-294553

(51) Int. Cl.
*H01L 51/54* (2006.01)
(52) U.S. Cl. .................. 257/40; 257/E51.036; 528/211; 528/219; 528/8; 252/500; 252/301.36
(58) Field of Classification Search ........... 257/40, 257/E51.036; 528/211, 219, 8; 252/500
See application file for complete search history.

(56) References Cited

U.S. PATENT DOCUMENTS

| | | | |
|---|---|---|---|
| 5,874,179 A | 2/1999 | Kreuder et al. | |
| 2004/0072989 A1 | 4/2004 | Son et al. | |
| 2004/0127666 A1 | 7/2004 | Inbasekaran et al. | |

FOREIGN PATENT DOCUMENTS

| | | | |
|---|---|---|---|
| GB | 2443774 A | 5/2008 | |
| JP | 61-103924 A | 5/1986 | |
| JP | 62-225518 A | 10/1987 | |
| JP | 10-122981 A | 5/1998 | |
| JP | 11-501955 A | 2/1999 | |
| JP | 2003-165829 A | 6/2003 | |
| JP | 2004-137456 A | 5/2004 | |
| WO | 2004/060970 A1 | 7/2004 | |

*Primary Examiner* — Long Pham
(74) *Attorney, Agent, or Firm* — Sughrue Mion, PLLC

(57) ABSTRACT

A copolymer comprising a repeating unit of the following formula (1) and a repeating unit of the following formula (2):

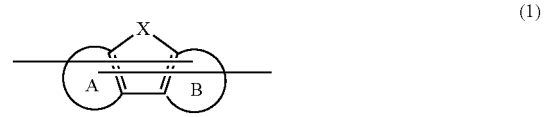

(1)

(wherein, a ring A and ring B represent each independently an aromatic ring optionally having a substituent. X is —O—, —S—, —S(=O)—, —S(=O)$_2$—, —Si(R$_1$)$_2$—Si(R$_1$)$_2$—, —Si(R$_1$)$_2$—, —B(R$_1$)—, —P(R$_1$)—, —P(=O)(R$_1$)—, —O—C(R$_1$)$_2$— or —N=C(R$_1$)—, and R$_1$ represents a substituent. When there are two or more R$_1$s in the same formula, they may be the same or different.)

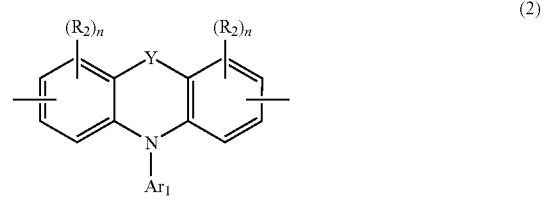

(2)

(wherein, Y is —O—, —S— or —C(=O)—. Ar$_1$ represents an aryl group optionally having a substituent or a monovalent heterocyclic group optionally having a substituent, and there is no substituent connected to atoms of the ring of Ar$_1$, the atoms being adjacent an atom of Ar$_1$ connected to a nitrogen atom in the formula. R$_2$ represents a substituent, and n represents an integer of from 0 to 3. When there are two or more R$_2$s in the formula, they may be the same or different.).

19 Claims, No Drawings

COPOLYMER AND POLYMER LIGHT EMITTING DEVICE USING THE SAME

TECHNICAL FIELD

The present invention relates to a copolymer and a polymer light emitting device (polymer LED) using the same.

BACKGROUND ART

Light emitting materials and charge transporting materials of high molecular weight are soluble in solvents and capable of forming an organic layer in a light emitting device (electroluminescence device) by an application method, thus, are under various investigations, and as an example thereof, a copolymer composed of a fluorenediyl group and a phenoxazinediyl group is known (Japanese Patent Application Laid-Open (JP-A) No. 2004-137456).

In the case of manufacturing of an electroluminescence device using the above-described copolymer, however, device properties, for example, its light emission initiation voltage thereof, are not necessarily sufficient.

An object of the present invention is to provide a copolymer which is useful as a light emitting material or charge transporting material, and showing excellent device properties such as low light emission initiation voltage and the like.

DISCLOSURE OF THE INVENTION

The present invention provides a copolymer comprising a repeating unit of the following formula (1) and a repeating unit of the following formula (2):

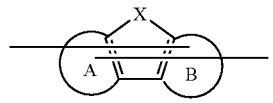

(1)

(wherein, a ring A and ring B represent each independently an aromatic ring optionally having a substituent. X is —O—, —S—, —S(=O)—, —S(=O)$_2$—, —Si(R$_1$)$_2$—Si(R$_1$)$_2$—, —Si(R$_1$)$_2$—, —B(R$_1$)—, —P(R$_1$)—, —P(=O)(R$_1$)—, —O—C(R$_1$)$_2$— or —N=C(R$_1$)—, and R$_1$ represents a substituent. When there are two or more R$_1$s in the formula, they may be the same or different.)

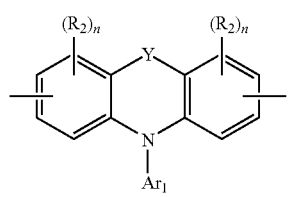

(2)

(wherein, Y is —O—, —S— or —C(=O)—. Ar$_1$ represents an aryl group optionally having a substituent or a monovalent heterocyclic group optionally having a substituent, and there is no substituent connected to atoms of the ring of Ar$_1$, the atoms being adjacent an atom of Ar$_1$ connected to a nitrogen atom in the formula. R$_2$ represents a substituent, and n represents an integer of from 0 to 3. When there are two or more R$_2$s in the formula, they may be the same or different.).

MODE FOR CARRYING OUT THE INVENTION

The copolymer of the present invention contains a repeating unit of the above-described formula (1).

In the above-described formula (1), a ring A and ring B represent each independently an aromatic ring optionally having a substituent, and the aromatic ring includes aromatic hydrocarbon rings and aromatic heterocyclic rings. The aromatic hydrocarbon ring includes aromatic hydrocarbon rings such as a benzene ring, naphthalene ring, anthracene ring, tetracene ring, pentacene ring, pyrene ring, phenanthrene ring and the like, and the aromatic heterocyclic ring includes a thiophene ring and pyridine ring. From the standpoint of easiness of synthesis of a monomer and of device properties, preferable are a benzene ring, naphthalene ring, anthracene ring and phenanthrene ring, and more preferable are a benzene ring and naphthalene ring.

X is —O—, —S—, —S(=O)—, —S(=O)$_2$—, —Si(R$_1$)$_2$—Si(R$_1$)$_2$—, —Si(R$_1$)$_2$—, —B(R$_1$)—, —P(R$_1$)—, —P(=O)(R$_1$)—, —O—C(R$_1$)$_2$— or —N=C(R$_1$)—, and R$_1$ represents a substituent.

R$^1$ is preferably selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group and cyano group. A hydrogen atom contained in these substituents may be substituted by a fluorine atom.

Here, the alkyl group may be linear, branched or cyclic, the carbon number is usually about from 1 to 20, preferably 3 to 20, and examples thereof include a methyl group, ethyl group, propyl group, i-propyl group, n-butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like, and for balance between heat resistance and standpoints such as solubility in an organic solvent, device properties, easiness of synthesis of a monomer and the like, preferable are a pentyl group, isoamyl group, hexyl group, octyl group, 2-ethylhexyl group, decyl group and 3,7-dimethyloctyl group.

The alkoxy group may be linear, branched or cyclic, the carbon number is usually about from 1 to 20, preferably 3 to 20, and examples thereof include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group and the like, and for balance between heat resistance and standpoints such as solubility in an organic solvent, device properties, easiness of synthesis of a monomer and the like, preferable are a pentyloxy group, hexyloxy group, octyloxy group, 2-ethylhexyloxy group, decyloxy group and 3,7-dimethyloctyloxy group.

The alkylthio group may be linear, branched or cyclic, the carbon number is usually about from 1 to 20, preferably 3 to 20, and examples thereof include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like, and for balance between heat resistance and standpoints such as solubility in an organic solvent, device properties, easiness of synthesis of a monomer and the like, preferable are a pentylthio group, hexylthio group, octylthio group, 2-ethylhexylthio group, decylthio group and 3,7-dimethyloctylthio group.

The aryl group is an atomic group obtained by removing one hydrogen atom from an aromatic hydrocarbon, and includes also those having a condensed ring, and those in which independent two or more benzene rings or condensed rings are bonded directly or via a group such as vinylene. The aryl group has a carbon number of usually about from 6 to 60, preferably 7 to 48, and examples thereof include a phenyl group, $C_1$ to $C_{12}$ alkoxyphenyl groups ($C_1$ to $C_{12}$ shows that the carbon number is 1 to 12, being applicable also in the following descriptions), $C_1$ to $C_{12}$ alkylphenyl groups, 1-naphtyl group, 2-naphtyl group, 1-anthracenyl group, 2-anthracenyl group, 9-anthracenyl group, pentafluorophenyl group and the like, and from the standpoints of solubility in an organic solvent, device properties, easiness of synthesis of a monomer and the like, preferable are $C_1$ to $C_{12}$ alkoxyphenyl groups and $C_1$ to $C_{12}$ alkylphenyl groups. Examples of the $C_1$ to $C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Examples of the $C_1$ to $C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like.

The aryloxy group has a carbon number of usually about from 6 to 60, preferably 7 to 48, and examples thereof include a phenoxy group, $C_1$ to $C_{12}$ alkoxyphenoxy groups, $C_1$ to $C_{12}$ alkylphenoxy groups, 1-naphtyloxy group, 2-naphtyloxy group, pentafluorophenyloxy group and the like, and from the standpoints of solubility in an organic solvent, device properties, easiness of synthesis of a monomer and the like, preferable are $C_1$ to $C_{12}$ alkoxyphenoxy groups and $C_1$ to $C_{12}$ alkylphenoxy groups.

Examples of the $C_1$ to $C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Examples of the $C_1$ to $C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group and the like.

The arylthio group has a carbon number of usually about from 3 to 60, and examples thereof include a phenylthio group, $C_1$ to $C_{12}$ alkoxyphenylthio groups, $C_1$ to $C_{12}$ alkylphenylthio groups, 1-naphtylthio group, 2-naphtylthio group, pentafluorophenylthio group and the like, and from the standpoints of solubility in an organic solvent, device properties, easiness of synthesis of a monomer and the like, preferable are $C_1$ to $C_{12}$ alkoxyphenylthio groups and $C_1$ to $C_{12}$ alkylphenylthio groups.

The arylalkyl group has a carbon number of usually about from 7 to 60, preferably 7 to 48, and examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and from the standpoints of solubility in an organic solvent, device properties, easiness of synthesis of a monomer and the like, preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about from 7 to 60, preferably 7 to 48, and examples thereof include phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and from the standpoints of solubility in an organic solvent, device properties, easiness of synthesis of a monomer and the like, preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylthio group has a carbon number of usually about from 7 to 60, preferably 7 to 48, and examples thereof include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups, 2-naphthyl-$C_1$ to $C_{12}$ alkylthio groups and the like, and from the standpoints of solubility in an organic solvent, device properties, easiness of synthesis of a monomer and the like, preferable are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a carbon number of usually about from 8 to 60, and examples thereof include phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like, and from the standpoints of solubility in an organic solvent, device properties, easiness of synthesis of a monomer and the like, preferable are $C_1$ to $C_{12}$ alkoxyphenyl-$C_2$ to $C_{12}$ alkenyl groups and $C_1$ to $C_{12}$ alkylphenyl-$C_2$ to $C_{12}$ alkenyl groups.

The arylalkynyl group has a carbon number of usually about from 8 to 60, and examples thereof include phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like, and from the standpoints of solubility in an organic solvent, device properties, easiness of synthesis of a monomer and the like, preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The substituted amino group includes amino groups substituted with one or two groups selected from an alkyl group, aryl group, arylalkyl group or monovalent heterocyclic group, and the alkyl group, aryl group, arylalkyl group or monovalent heterocyclic group optionally has a substituent. The carbon number of the substituted amino group is usually about from 1 to 60, preferably 2 to 48 not including the carbon number of the substituent.

Examples include a methylamino group, dimethylamino group, ethylamino group, diethylamino group, propylamino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$ to $C_{12}$ alkoxyphenylamino group, di($C_1$ to $C_{12}$ alkoxyphenyl)amino group, di($C_1$ to $C_{12}$ alkylphenyl)amino group, 1-naphthylamino group, 2-naphthylamino group, pentafluorophenylamino group, pyridylamino group, pyridazinylamino group, pyrimidylamino group, pyrazylamino group, triazylamino group, phenyl-$C_1$ to $C_{12}$ alkylamino group, $C_1$ to $C_{12}$ alkoxyphenyl-$C_1$ to $C_{12}$ alkylamino group, $C_1$ to $C_{12}$ alkylphenyl-$C_1$ to $C_{12}$ alkylamino group, di($C_1$ to $C_{12}$ alkoxyphenyl-$C_1$ to $C_{12}$ alkyl)amino group, di($C_1$ to $C_{12}$ alkylphenyl-$C_1$ to $C_{12}$ alkyl)amino group, 1-naphthyl-$C_1$ to $C_{12}$ alkylamino group, 2-naphthyl-$C_1$ to $C_{12}$ alkylamino group and the like.

The substituted silyl group includes silyl groups substituted with one, two or three groups selected from an alkyl group, aryl group, arylalkyl group or monovalent heterocyclic group. The carbon number of the substituted silyl group is usually about from 1 to 60, preferably 3 to 48. The alkyl group, aryl group, arylalkyl group or monovalent heterocyclic group optionally has a substituent.

Examples include a trimethylsilyl group, triethylsilyl group, tripropylsilyl group, tri-i-propylsilyl group, dimethyl-i-propylsilyl group, diethyl-i-propylsilyl group, t-butyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$ to $C_{12}$ alkylsilyl group, $C_1$ to $C_{12}$ alkoxyphenyl-$C_1$ to $C_{12}$ alkylsilyl group, $C_1$ to $C_{12}$ alkylphenyl-$C_1$ to $C_{12}$ alkylsilyl group, 1-naphthyl-$C_1$ to $C_{12}$ alkylsilyl group, 2-naphthyl-$C_1$ to $C_{12}$ alkylsilyl group, phenyl-$C_1$ to $C_{12}$ alkyldimethylsilyl group, triphenylsilyl group, tri-p-xylylsilyl group, tribenzylsilyl group, diphenylmethylsilyl group, t-butyldiphenylsilyl group, dimethylphenylsilyl group and the like.

Examples of the halogen atom include a fluorine atom, chlorine atom, bromine atom and iodine atom.

The acyl group has a carbon number of usually about from 2 to 20, preferably 2 to 18, and examples thereof include an acetyl group, propionyl group, butyryl group, isobutyryl group, pivaloyl group, benzoyl group, trifluoroacetyl group, pentafluorobenzoyl group and the like.

The acyloxy group has a carbon number of usually about from 2 to 20, preferably 2 to 18, and examples thereof include an acetoxy group, propionyloxy group, butyryloxy group, isobutyryloxy group, pivaloyloxy group, benzoyloxy group, trifluoroacetyloxy group, pentafluorobenzoyloxy group and the like.

The imine residue includes residues obtained by removing one hydrogen atom from imine compounds (meaning organic compounds having —N=C— in the molecule. Examples thereof include aldimines, ketimines, and compounds obtained by substituting a hydrogen atom on N of these compounds by an alkyl group and the like), and has a carbon number of usually about from 2 to 20, preferably 2 to 18. Specifically exemplified are groups of the following structural formulae, and the like.

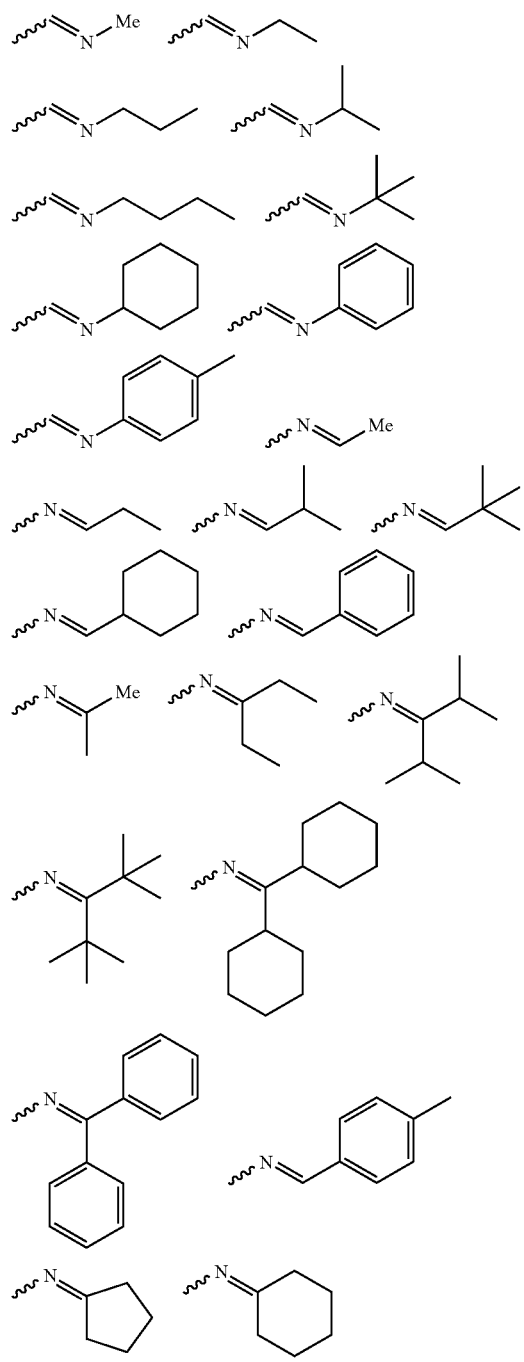

The amide group has a carbon number of usually about from 2 to 20, preferably 2 to 18, and examples thereof include a formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group and the like.

The acid imide group includes residues obtained by removing a hydrogen atom bonded to its nitrogen atom of an acid imide, and the carbon number is about from 4 to 20, and specifically exemplified are the following groups and the like.

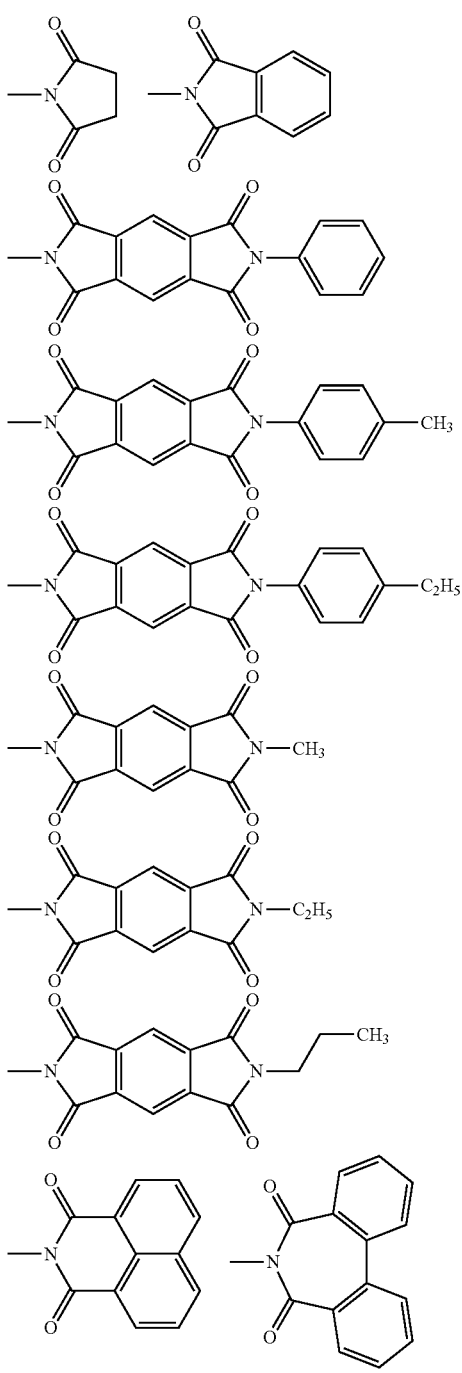

quinolyl group and the like, and preferable are a thienyl group, $C_1$ to $C_{12}$ alkylthienyl group, pyridyl group, $C_1$ to $C_{12}$ alkylpyridyl group.

The substituted carboxyl group includes carboxyl groups substituted with an alkyl group, aryl group, arylalkyl group or monovalent heterocyclic group, and the carbon number is usually about from 2 to 60, preferably 2 to 48, and examples thereof include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group, and the like. The alkyl group, aryl group, arylalkyl group or monovalent heterocyclic group optionally has a substituent. The carbon number of the substituted carboxyl group does not include the carbon number of the substituent.

As specific structures of the repeating unit of the above-described formula (1), the following formulae (1-4) to (1-59) are mentioned. The following formulae (1-4) to (1-59) optionally have a substituent, and have, from the standpoint of solubility, preferably at least one substituent, more preferably two or more substituents. $R_1$ in the formula represents the same meaning as described above.

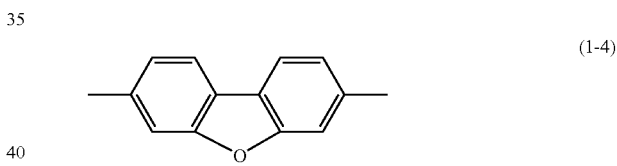
(1-4)

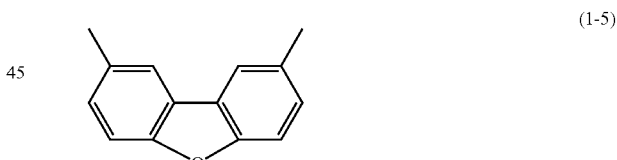
(1-5)

The monovalent heterocyclic group means an atomic group remaining after removing one hydrogen atom from a heterocyclic compound, and the carbon number is usually about from 4 to 60, preferably 4 to 20. The carbon number of a heterocyclic group does not include the carbon number of a substituent. Here, the heterocyclic compound refers to organic compounds having a cyclic structure in which atoms constituting the cyclic structure include not only a carbon atom, but also a hetero atom such as oxygen, sulfur, nitrogen, phosphorus, boron and the like contained in the ring. Specifically exemplified are a thienyl group, $C_1$ to $C_{12}$ alkylthienyl group, pyrrolyl group, furyl group, pyridyl group, $C_1$ to $C_{12}$ alkylpyridyl group, piperidyl group, quinolyl group, iso-

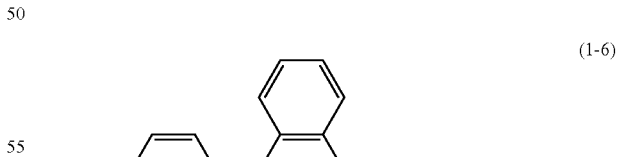
(1-6)

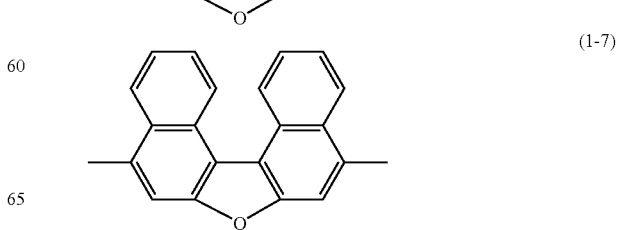
(1-7)

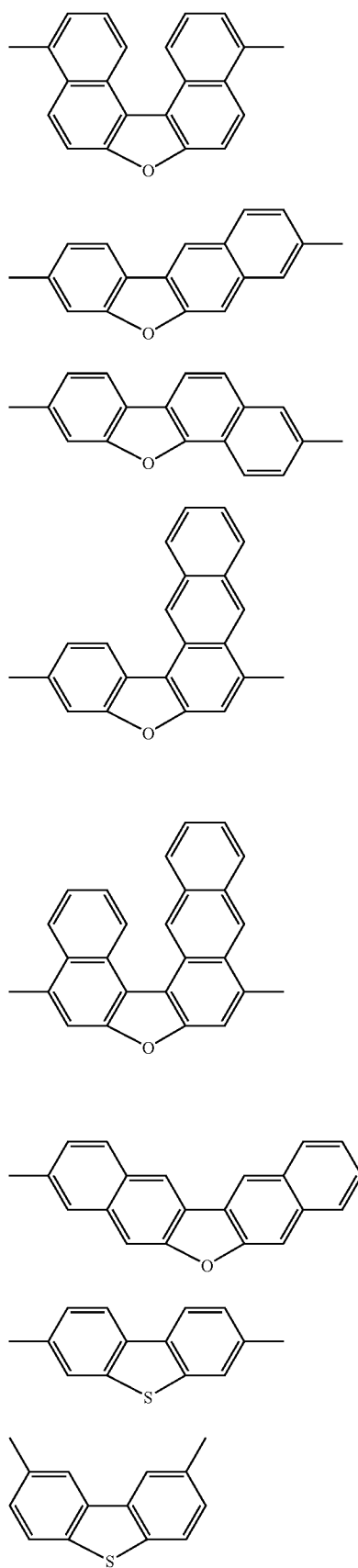
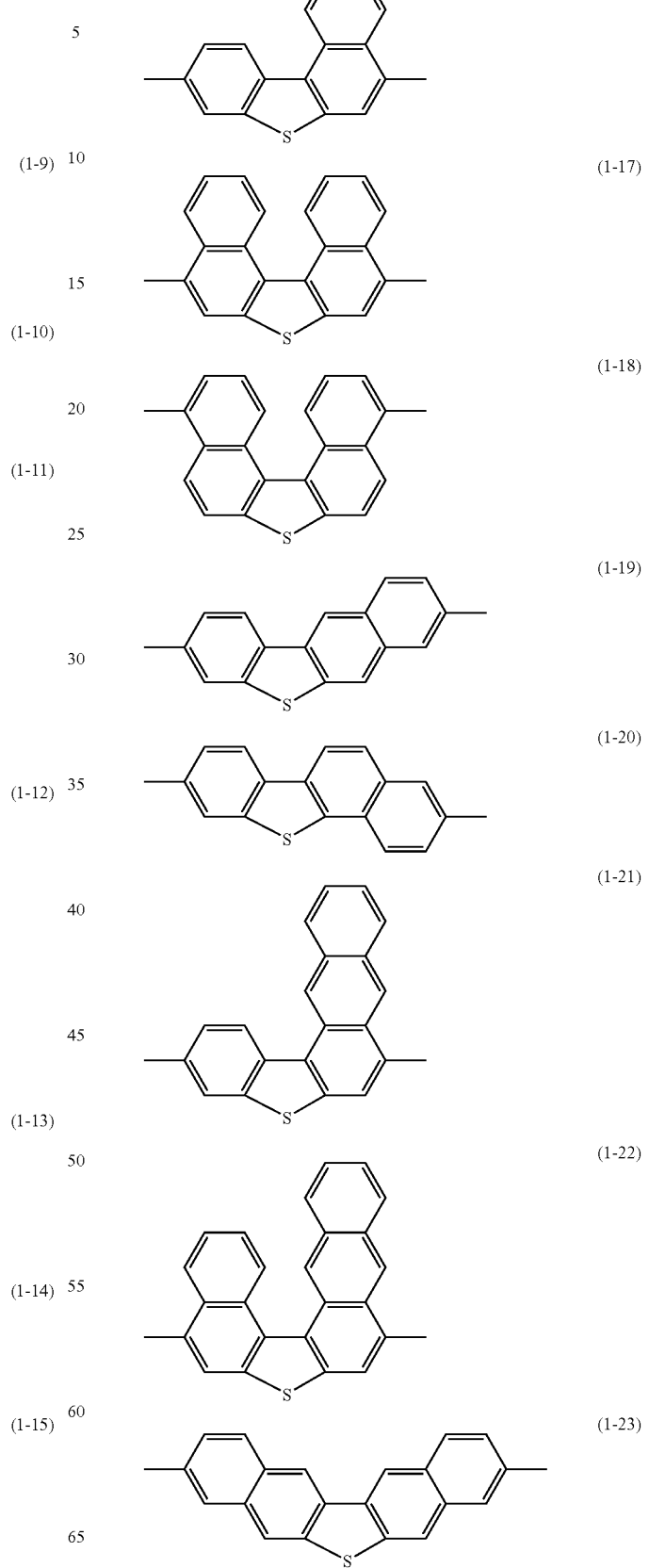

(1-24) 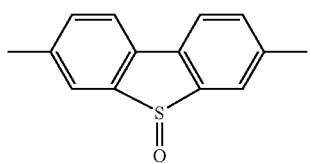
(1-25) 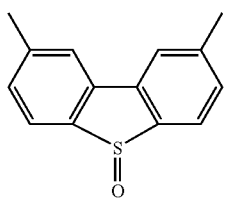
(1-26) 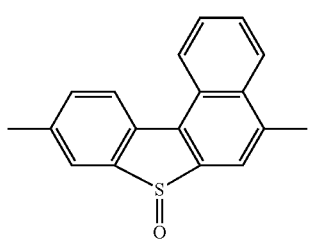
(1-27) 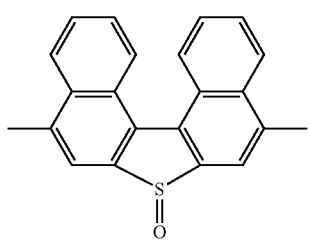
(1-28) 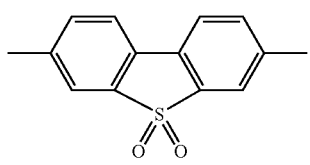
(1-29) 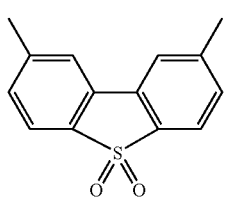
(1-30) 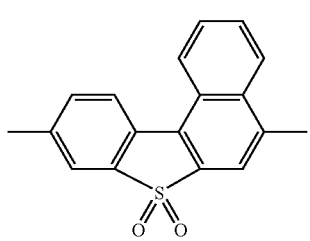
(1-31) 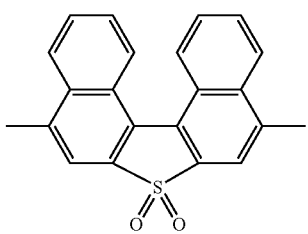
(1-32) 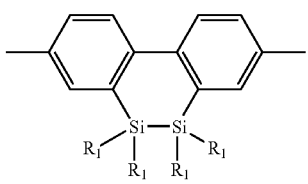
(1-33) 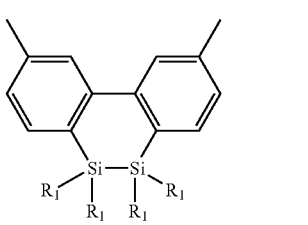
(1-34) 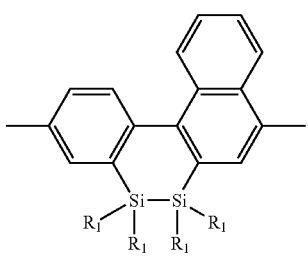
(1-35) 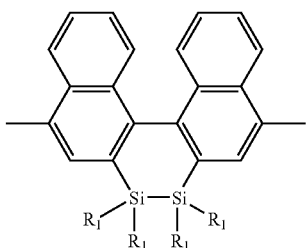
(1-36) 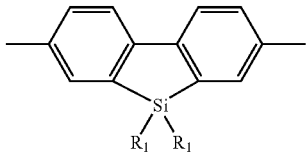
(1-37) 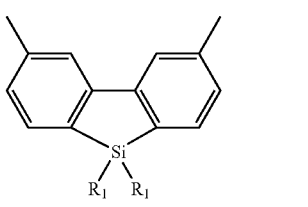

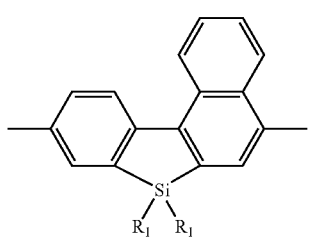
(1-38)
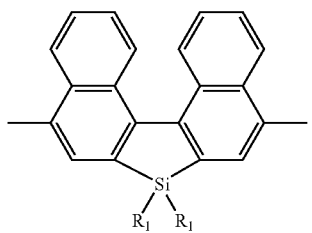
(1-39)
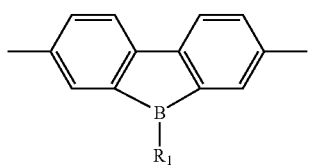
(1-40)
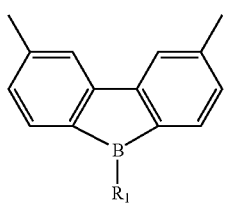
(1-41)
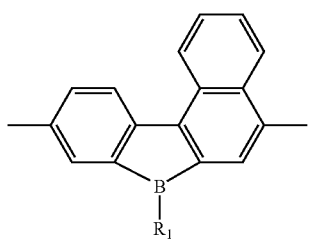
(1-42)
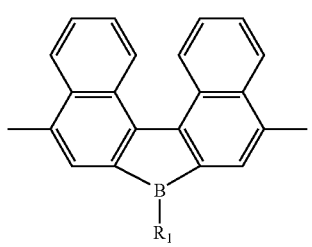
(1-43)
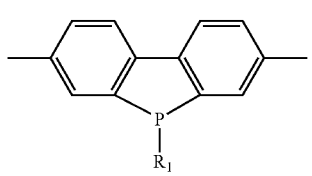
(1-44)
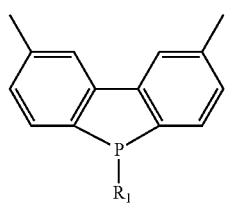
(1-45)
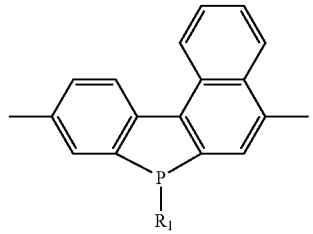
(1-46)
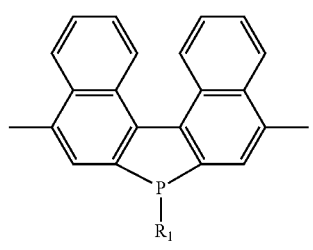
(1-47)
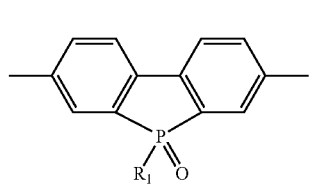
(1-48)
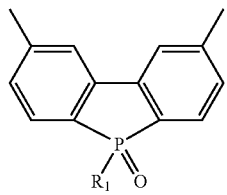
(1-49)
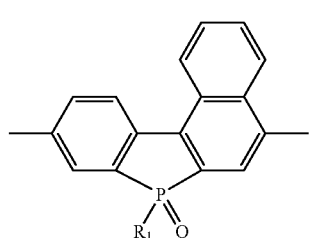
(1-50)
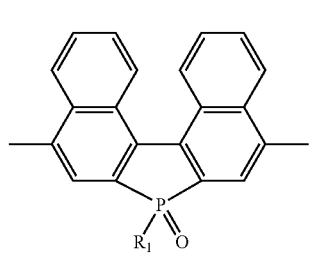
(1-51)

-continued (1-52) 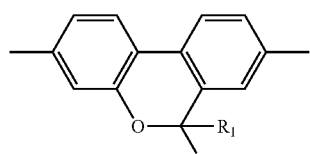

(1-53) 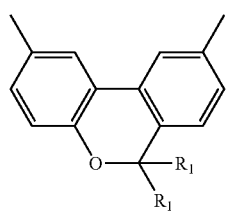

(1-54) 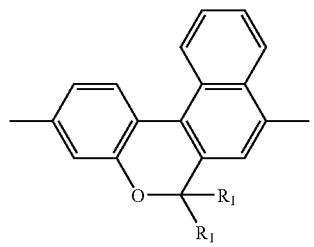

(1-55) 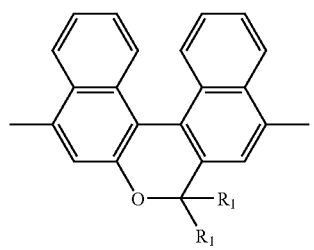

(1-56) 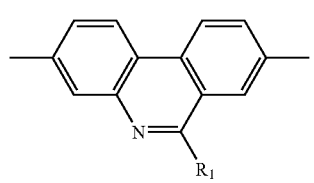

(1-57) 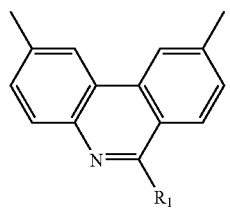

(1-58) 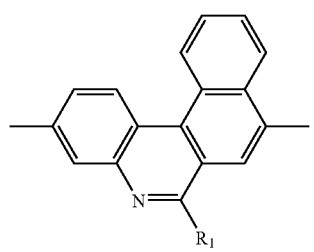

-continued (1-59) 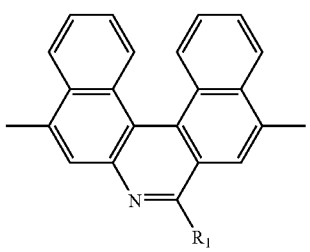

Of the repeating units of the above-described formula (1), preferable are repeating units of the following formulae (1-1), (1-2) and (1-3), more preferable are repeating units of the following formulae (1-1) and (1-2), from the standpoints of device properties, fluorescence intensity and the like.

(1-1) 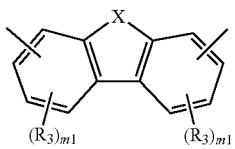

(1-2) 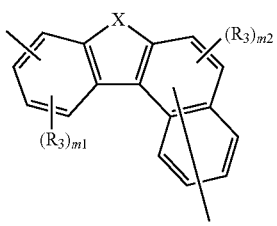

(1-3) 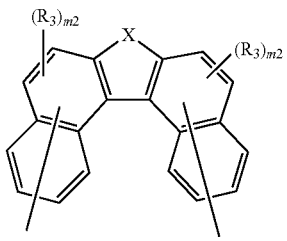

(wherein, X represents the same meaning as described above, and $R_3$ represents a substituent. m1 represents an integer of from 0 to 3, and m2 represents an integer of from 0 to 5. When there are two or more m1s and m2s in the same formula, they may be the same or different, respectively, and when there are two or more $R_3$s in the same formula, they may be the same or different.).

Of the repeating units of the above-described formulae (1-1), (1-2) and (1-3), preferable are repeating units of the following formulae (1-A), (1-B) and (1-C) from the standpoints of easiness of synthesis of a monomer, device properties, fluorescence intensity and the like.

(1-A) 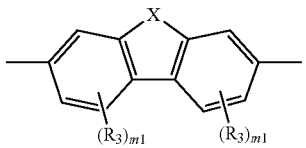

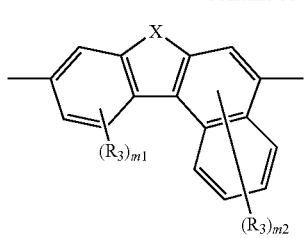

(1-B)

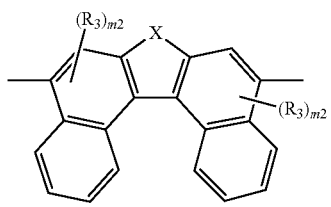

(1-C)

(wherein, X, $R_3$, m1 and m2 represent the same meanings as described above.)

In the above-described formulae (1), (1-1), (1-2), (1-A), (1-B) and (1-C), X is preferably —O—, —S—, —S(=O)—, —S(=O)$_2$—, —Si($R_1$)$_2$—, —B($R_1$)— or —O—C($R_1$)$_2$—, more preferably —O—, —S—, —Si($R_1$)$_2$— or —O—C($R_1$)$_2$—, further preferably —O— or —S—, from the standpoints of fluorescence intensity and from the standpoint of device properties.

The substituent on the ring A or the ring B in the above-described formula (1), or $R_3$ in the above-described formulae (1-1) to (1-3) and (1-A) to (1-C) is preferably selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group and cyano group, from the standpoints of solubility in an organic solvent, device properties, easiness of synthesis of a monomer and the like. A hydrogen atom contained in these substituents may be substituted by a fluorine atom.

The sum of m1 and m2 in the above-described formulae (1-1) to (1-3) and (1-A) to (1-C) is preferably 1 or more, and more preferably 2 or more, from the standpoint of solubility.

The copolymer of the present invention contains a repeating unit of the above-described formula (2), in addition to the repeating unit of the above-described formula (1).

In the above-described formula (2), Y is —O—, —S— or —C(=O)—. Of them, Y is preferably —O— or —S— from the standpoint of the fluorescence intensity of a polymer compound. $Ar_1$ represents an aryl group optionally having a substituent or a monovalent heterocyclic group optionally having a substituent, and there is no substituent connected to atoms of the ring of $Ar_1$, the atoms being adjacent to an atom of $Ar_1$ connected to a nitrogen atom in the formula. $R_2$ represents a substituent, and n represents an integer of from 0 to 3. Two or more n's in the same formula may be the same or different. When there are two or more $R_2$s in the same formula, they may be the same or different.

$R_2$ is preferably selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group and cyano group. A hydrogen atom contained in these substituents may be substituted by a fluorine atom.

As examples of an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group, the above-described groups mentioned as examples of $R_1$ are exemplified. Of these substituents, an alkyl group, alkoxy group, alkylthio group, aryl group, aryloxy group, arylthio group, arylalkyl group, arylalkoxy group and monovalent heterocyclic group are preferable, and an alkyl group, alkoxy group and aryl group are more preferable, from the standpoints of solubility and device properties.

n is preferably 0 or 1 from the standpoint of easiness of synthesis of a monomer.

Structures of the repeating unit of the above-described formula (2) include structures of the following formulae (2-2) to (2-15). In the following formulae (2-2) to (2-15), an aryl group or heteroaryl group connected to a nitrogen atom optionally has a substituent. Here, there is no substituent connected to atoms of the ring of the aryl group or heteroaryl group, the atoms being adjacent to an atom of the ring of the aryl group or heteroaryl group connected to a nitrogen atom in the formula. Specifically, the position carrying attached * has no substituent in the following drawings.

From the standpoint of solubility, it is preferable that the aryl group or heteroaryl group has at least one substituent. $R_2$ and n in the formulae represent the same meanings as described above.

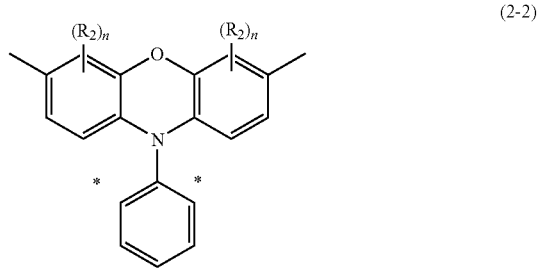

(2-2)

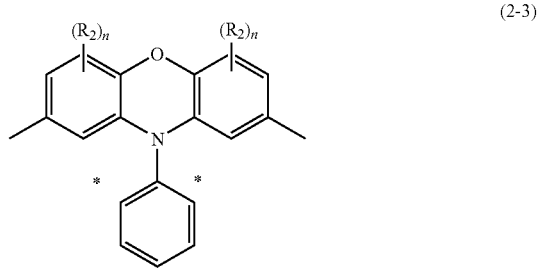

(2-3)

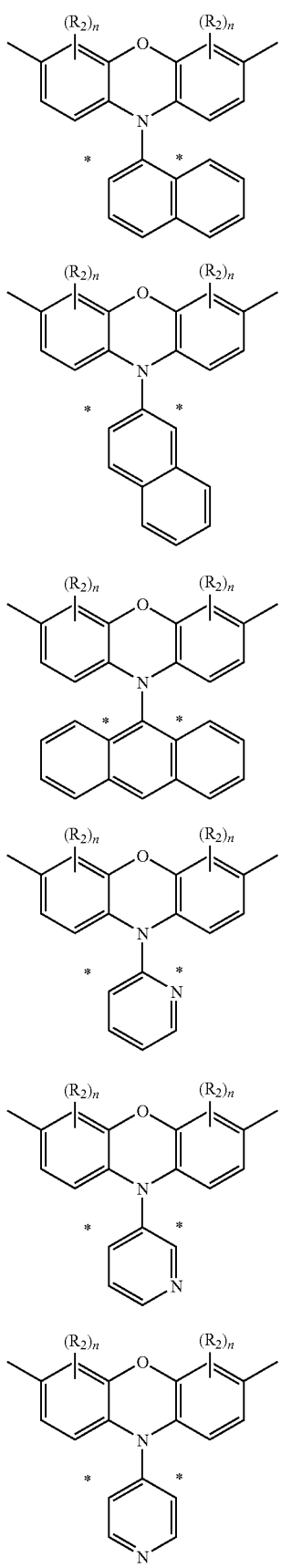
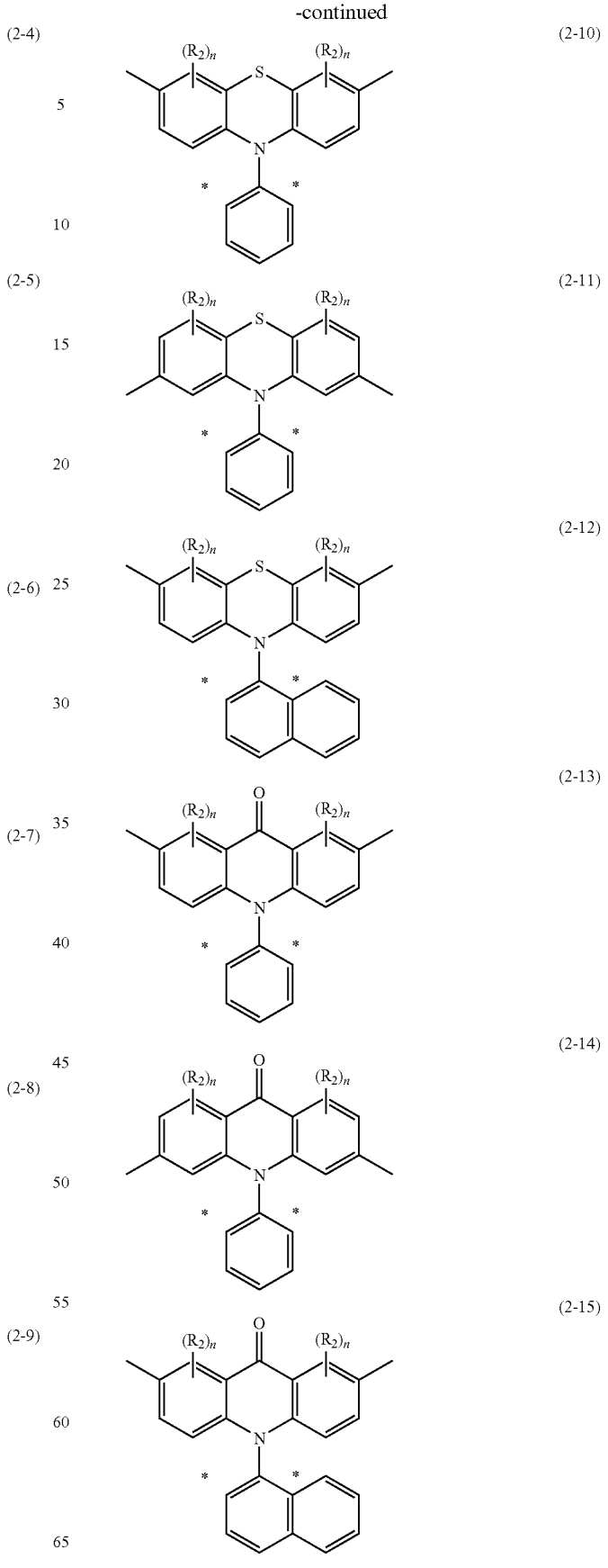

Of the above-described formulae (2), a structure of the following formula (2-1) is preferable from the standpoints of easiness of synthesis of a monomer, solubility, device properties and the like.

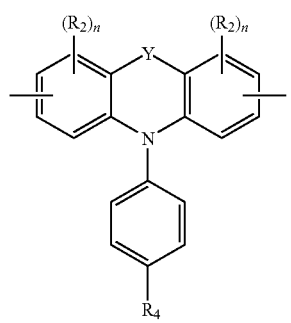

(2-1)

(wherein, Y, $R_2$ and n represent the same meanings as described above, and $R_4$ represents a substituent.).

$R_4$ is preferably selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, nitro group and cyano group. A hydrogen atom contained in these substituents may be substituted by a fluorine atom. Examples of an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group include the above-described groups mentioned as examples of $R_1$. Of these substituents, an alkyl group, alkoxy group, alkylthio group, aryl group, aryloxy group, arylthio group, arylalkyl group, arylalkoxy group and monovalent heterocyclic group are preferable, an alkyl group and alkoxy group are more preferable, and an alkyl group is further preferable, from the standpoints of solubility and device properties.

In the copolymer of the present invention, the amount of the repeating unit of the above-described formula (1) is preferably 10 mol % or more, more preferably 30 mol % or more, further preferably 50 mol % or more, more preferably 60 mol % or more, from the standpoints of fluorescence intensity and device properties. The amount of the repeating unit of the above-described formula (2) is preferably 1 mol % or more, more preferably 10 mol % or more, from the standpoints of fluorescence intensity, device properties and the like. The proportion of the repeating unit of the above-described formula (1) to the sum of the repeating unit of the above-described formula (1) and the repeating unit of the above-described formula (2) is preferably from 40 to 99 mol %, more preferably from 60 to 90 mol %, from the standpoint of device properties.

The copolymer of the present invention may contain also a repeating unit other than the repeating units of the above-described formulae (1) and (2).

The examples of repeating unit other than the repeating units of the above-described formulae (1) and (2) are repeating units of the following formula (3).

$$—Ar_2— \quad (3)$$

(wherein, $Ar_2$ represents an arylene group, divalent heterocyclic group, divalent aromatic amine group or divalent group having a metal complex structure.).

Here, the arylene group is an atomic group obtained by removing two hydrogen atoms from an aromatic hydrocarbon, and includes those having a condensed ring, and those obtained by bonding of two or more independent benzene rings or condensed rings directly or via a group such as vinylene and the like. The arylene group optionally has a substituent. The carbon number of a portion excluding substituents of the arylene group is usually about from 6 to 60, preferably 6 to 20. The total carbon number including substituents of the arylene group is usually about from 6 to 100.

Examples of the arylene group are phenylene groups (for example, the following formulae 1 to 3), naphthalenediyl groups (the following formulae 4 to 13), anthracene-diyl groups (the following formulae 14 to 19), biphenyl-diyl groups (the following formulae 20 to 25), terphenyl-diyl groups (the following formulae 26 to 28), condensed ring compound groups (the following formulae 29 to 35), fluorene-diyl groups (the following formulae 36 to 38), stilbene-diyl groups (the following formulae 39 to 42), distilbene-diyl groups (the following formulae 43, 44), and the like.

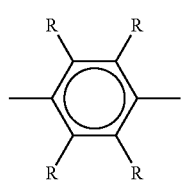

1

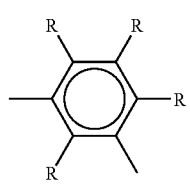

2

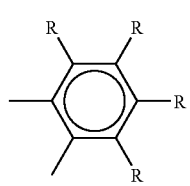

3

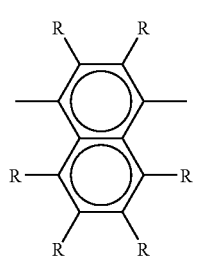

4

5
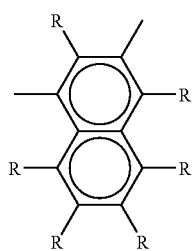
6
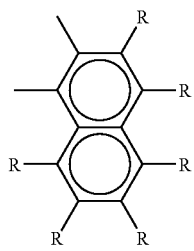
7
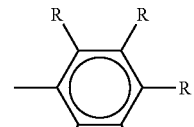
8
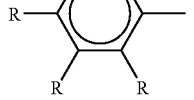
9
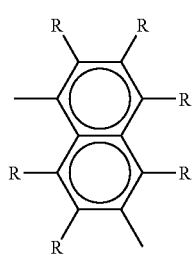
10
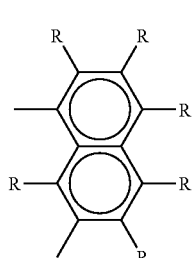
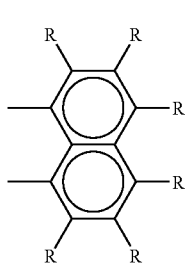
11
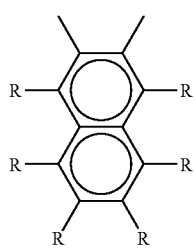
12
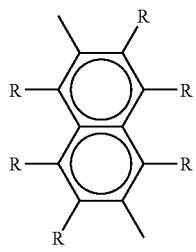
13
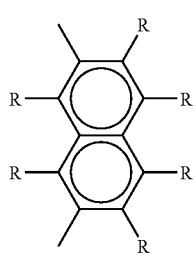
14
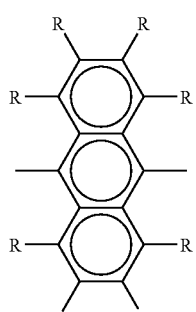
15
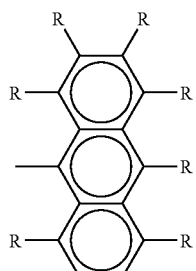

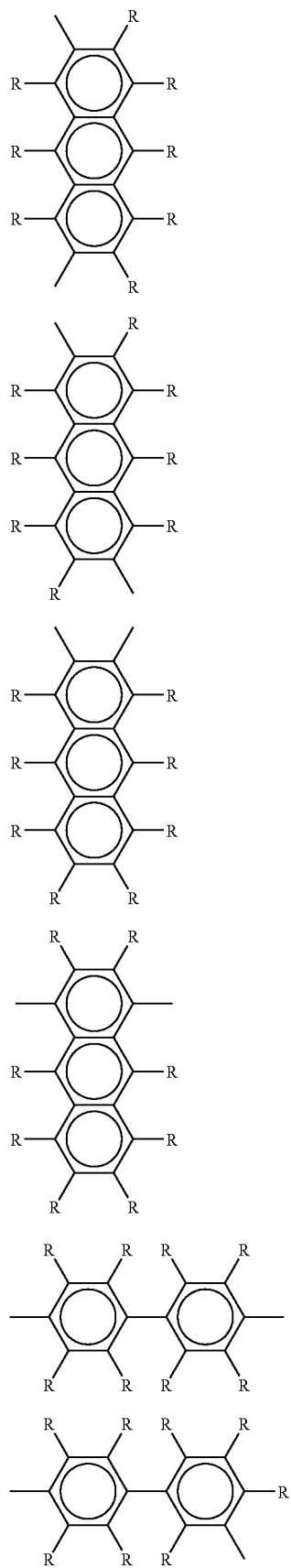
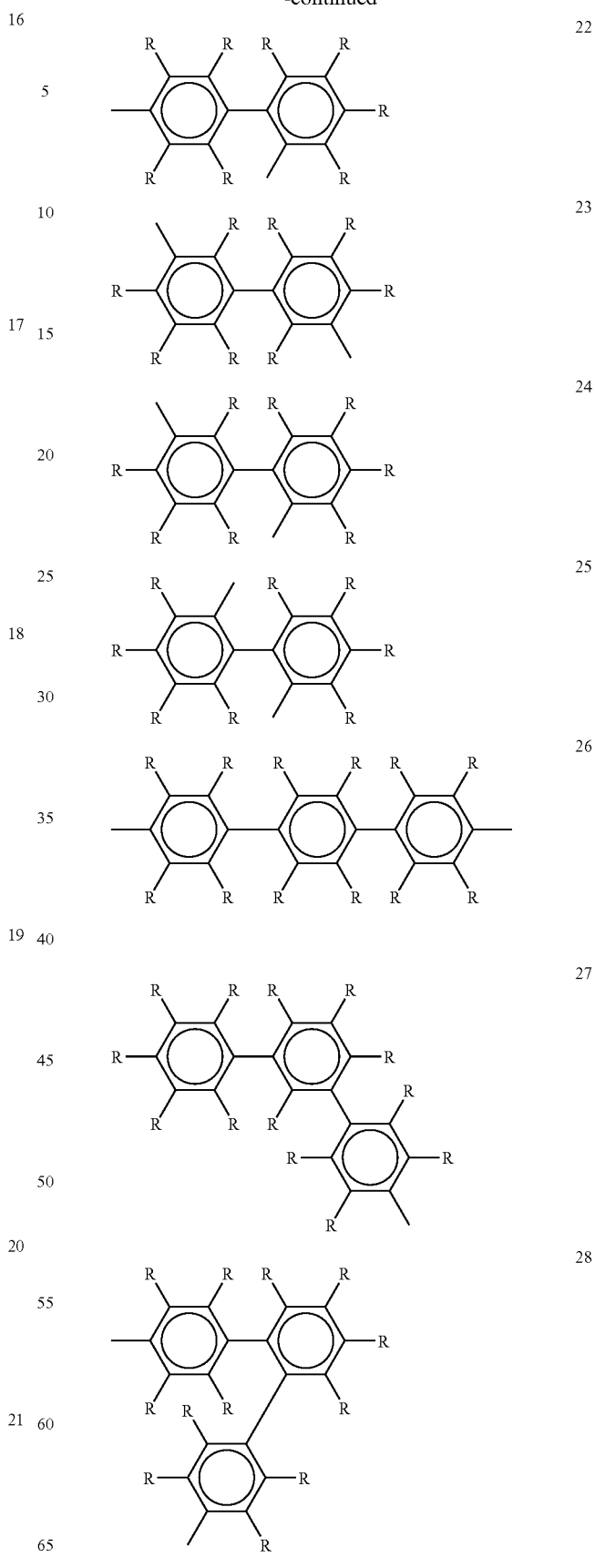

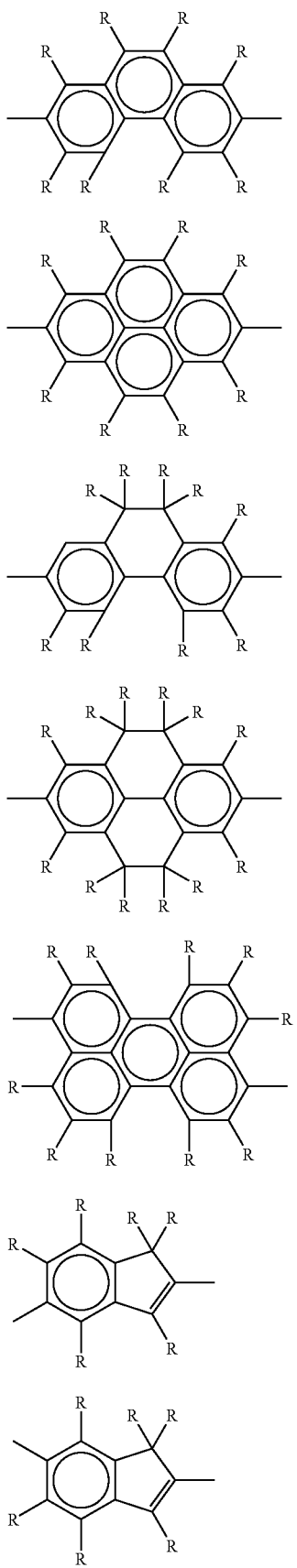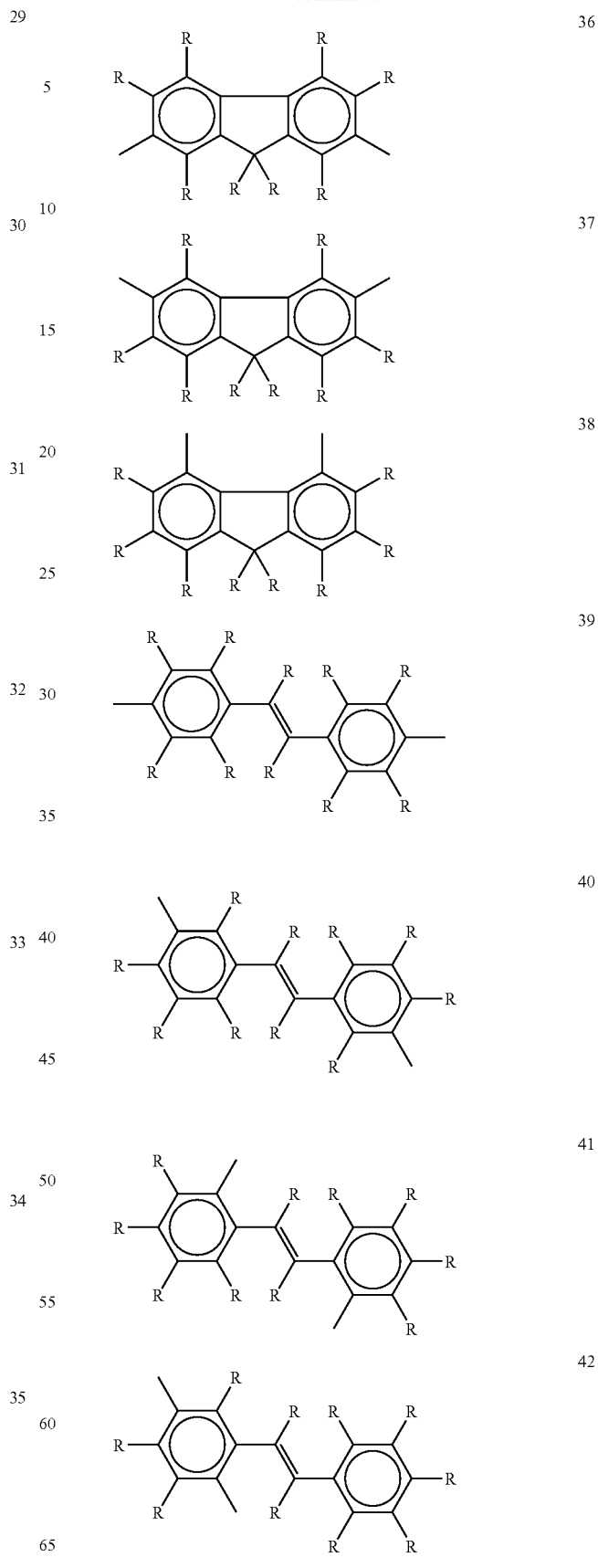

-continued

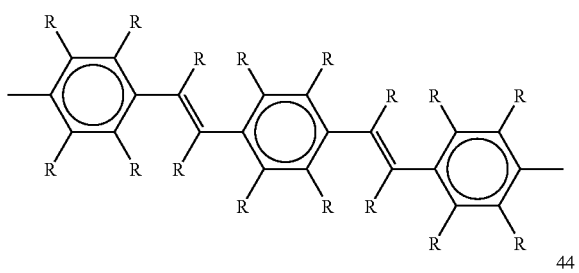

43

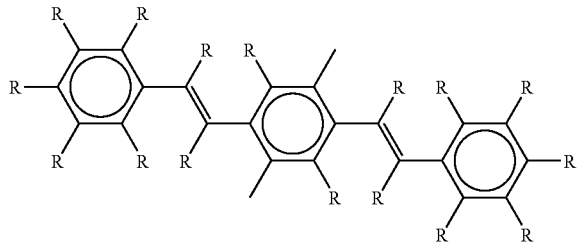

44

In the formulae 1 to 44, Rs represent a hydrogen atom or substituent, and the substituent includes an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, and cyano group. A hydrogen atom contained in these substituents may be substituted by a fluorine atom. Examples of an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group include the same groups as the above-described examples of $R_1$. It is preferable that at least one R is other than a hydrogen atom from the standpoints of solubility and device properties. The substituent is preferably an alkyl group, alkoxy group, alkylthio group, aryl group, aryloxy group, arylthio group, arylalkyl group, arylalkoxy group or monovalent heterocyclic group, more preferably an alkyl group, alkoxy group or aryl group.

The divalent heterocyclic group means an atomic group remaining after removing two hydrogen atoms from a heterocyclic compound, and this group optionally has a substituent. Here, the heterocyclic compound refers to organic compounds having a cyclic structure in which elements constituting the ring include not only a carbon atom, but also a hetero atom such as oxygen, sulfur, nitrogen, phosphorus, boron, arsenic and the like. Of divalent heterocyclic groups, aromatic heterocyclic groups are preferable. The carbon number of a portion excluding substituents of the divalent heterocyclic group is usually about from 3 to 60. The total carbon number including substituents of the divalent heterocyclic group is usually about from 3 to 100.

Examples of the divalent heterocyclic group include the following groups.

Divalent heterocyclic groups containing nitrogen as a hetero atom; pyridine-diyl group (the following formulae 45 to 50), diazaphenylene group (the following formulae 51 to 54), quinolinediyl group (the following formulae 55 to 69), quinoxalinediyl group (the following formulae 70 to 74), acridinediyl group (the following formulae 75 to 78), bipyridyldiyl group (the following formulae 79 to 81), phenanthrolinediyl group (the following formulae 82 to 84), and the like.

Groups having a carbazole structure (the following formulae 85 to 87).

5-membered ring heterocyclic groups containing oxygen, silicon, nitrogen, sulfur, selenium and the like as a hetero atom (the following formulae 88 to 92).

5-membered ring condensed hetero groups containing oxygen, silicon, nitrogen, selenium and the like as a hetero atom (the following formulae 93 to 103).

5-membered ring heterocyclic groups containing oxygen, silicon, nitrogen, sulfur, selenium and the like as a hetero atom, containing bonding at α-position of its hetero atom to form a dimer or oligomer (the following formulae 104 to 105).

5-membered ring heterocyclic groups containing oxygen, silicon, nitrogen, sulfur, selenium and the like as a hetero atom, containing bonding to a phenyl group at α-position of its hetero atom (the following formulae 106 to 112).

5-membered ring condensed heterocyclic groups containing oxygen, nitrogen, sulfur and the like as a hetero atom, containing substitution with a phenyl group, furyl group or thienyl group (the following formulae 113 to 118).

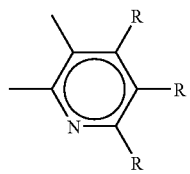

45

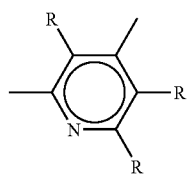

46

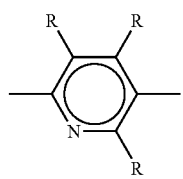

47

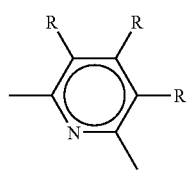

48

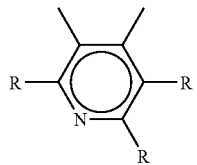

49

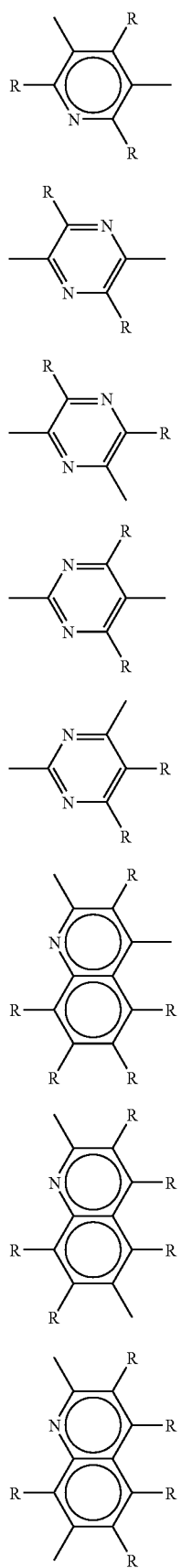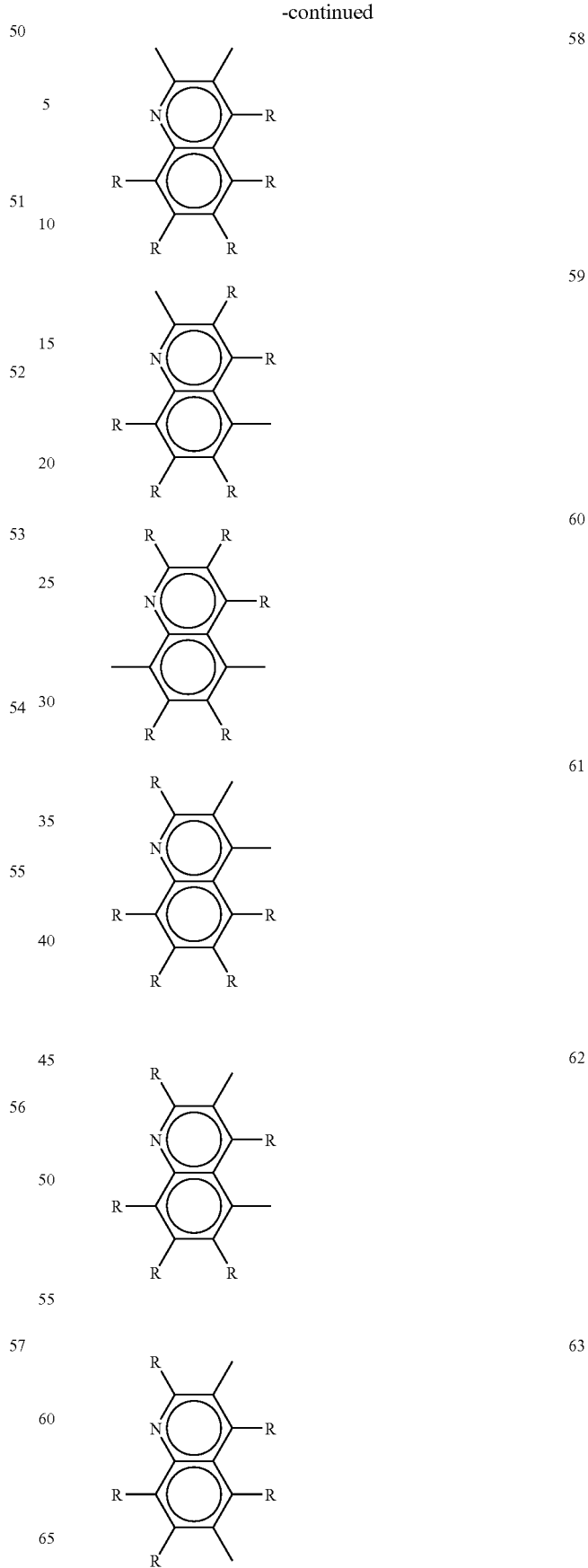

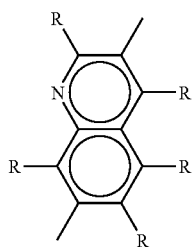
64
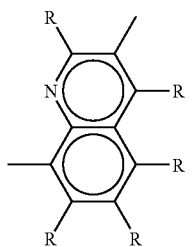
65
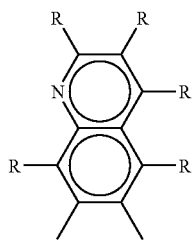
66
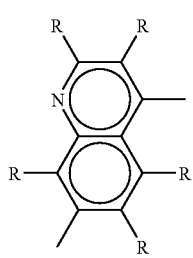
67
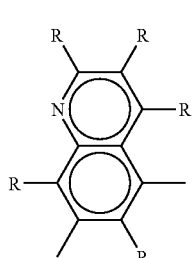
68
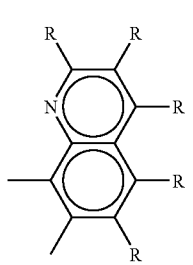
69
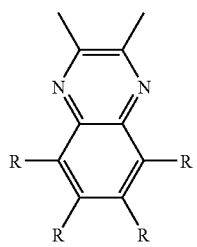
70
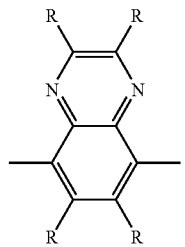
71
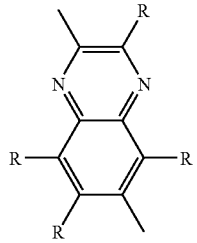
72
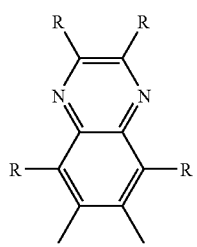
73
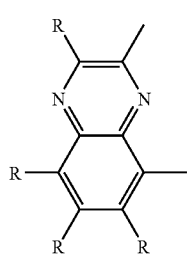
74
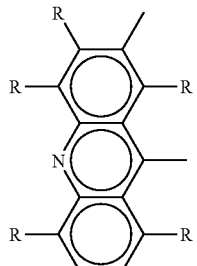
75

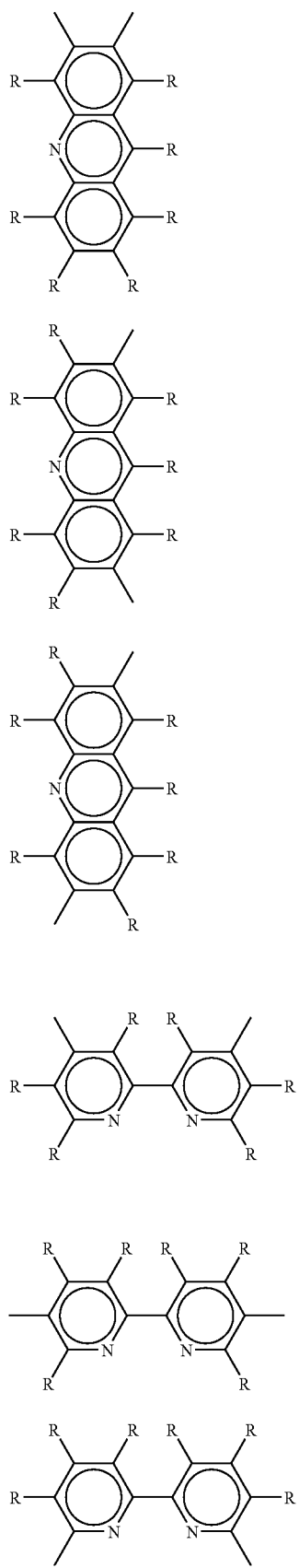
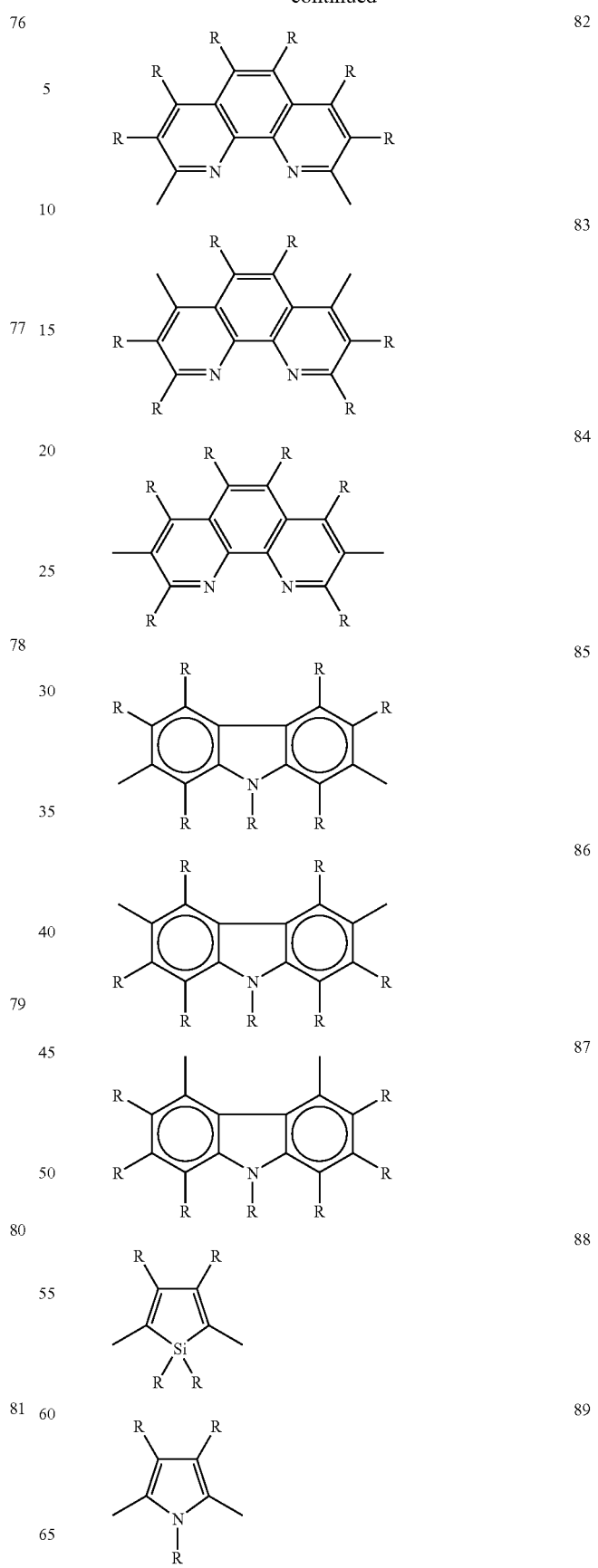

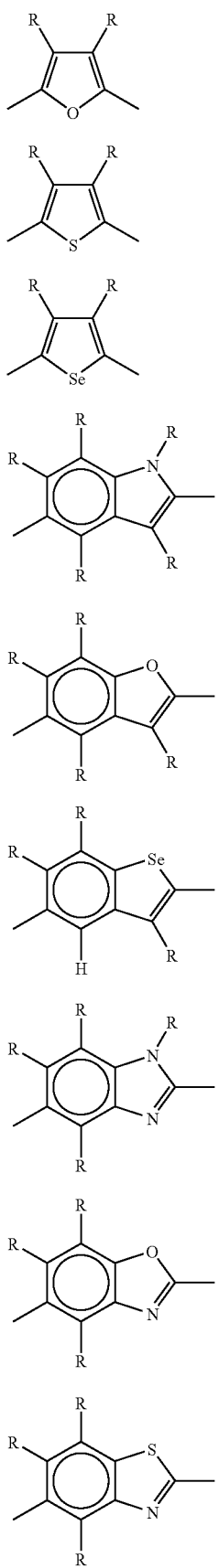
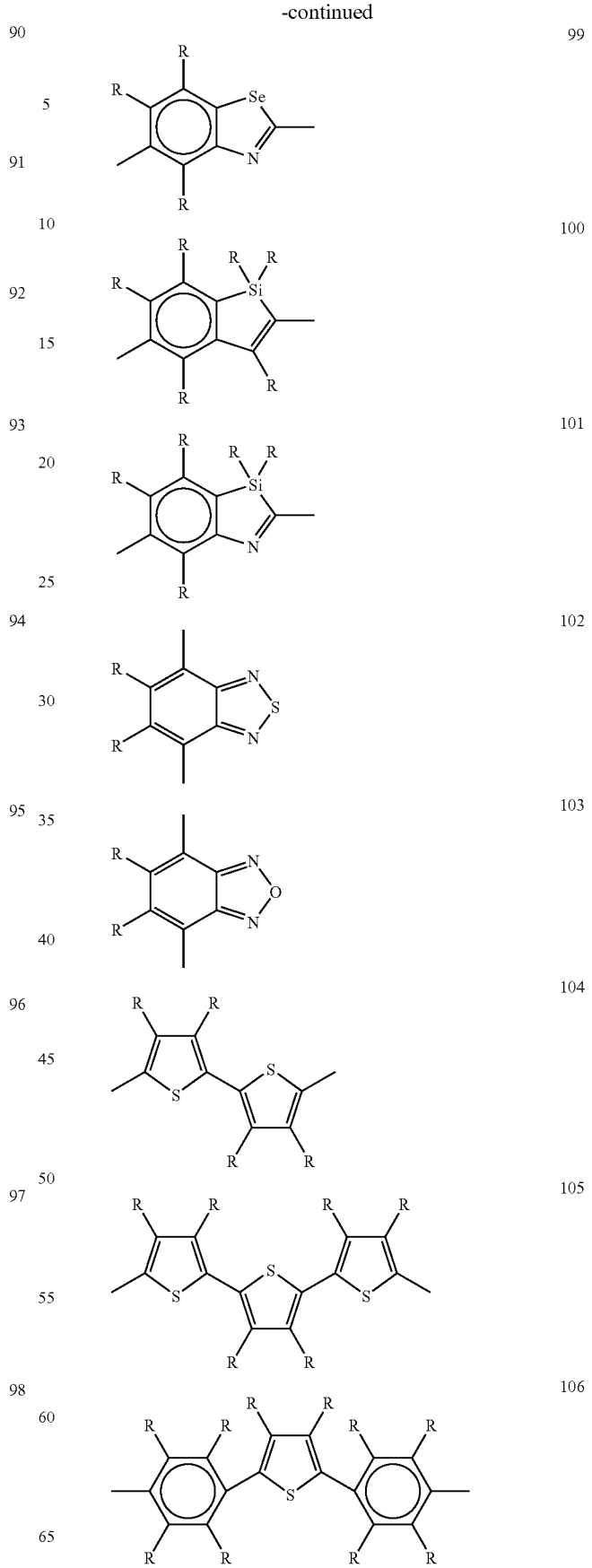

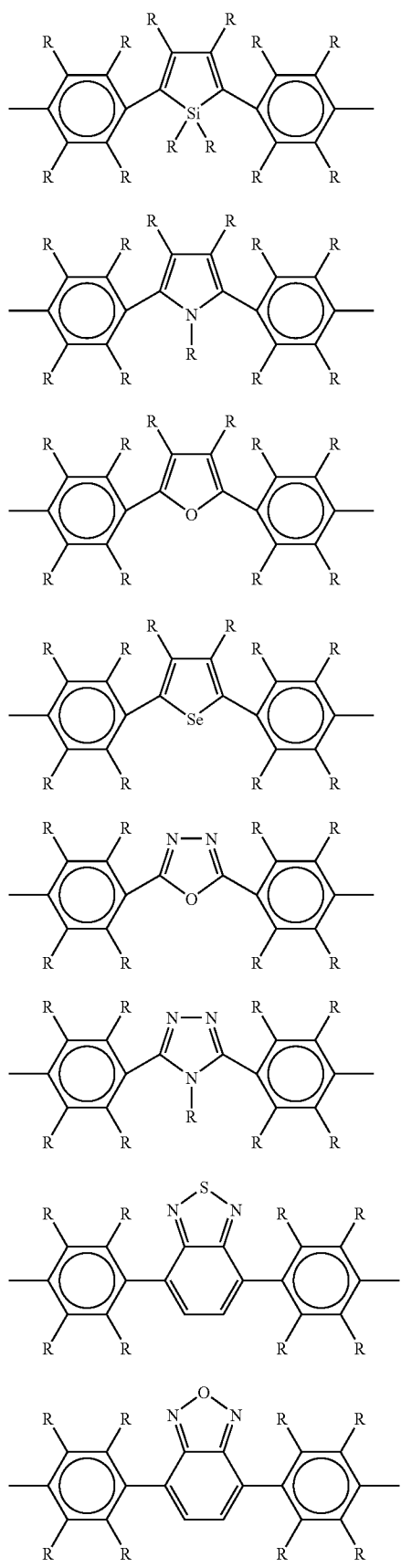

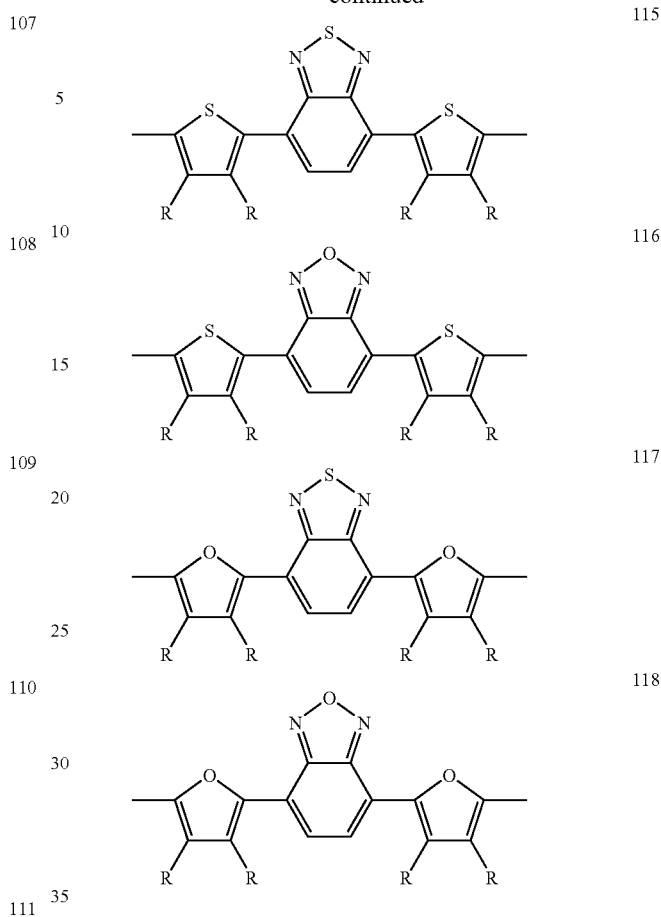

The definitions and examples of Rs in the formulae are the same as described above.

The divalent aromatic amine group includes atomic groups obtained by removing two hydrogen atoms from an aromatic ring of a compound derived from an aromatic tertiary amine. Of divalent aromatic amine groups, repeating units of the following formula (4) are preferable from the standpoint of changing of light emission wavelength, from the standpoint of enhancement of light emission efficiency, and from the standpoint of improvement in heat resistance.

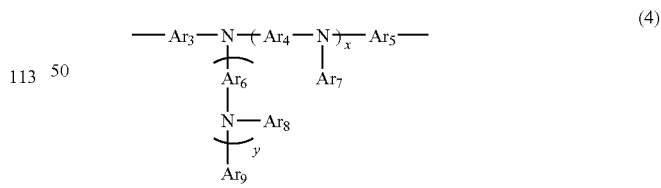

(wherein, $Ar_3$, $Ar_4$, $Ar_5$ and $Ar_6$ represent each independently an arylene group or divalent heterocyclic group. $Ar_7$, $Ar_8$ and $Ar_9$ represent each independently an aryl group or monovalent heterocyclic group. $Ar_3$, $Ar_4$, $Ar_5$, $Ar_6$, $Ar_7$, $Ar_8$ and $Ar_9$ optionally has a substituent. x and y represent each independently 0 or a positive integer.).

From the standpoints of device properties such as life and the like and of easiness of synthesis of a monomer, x is preferably 0 to 2, more preferably 0 or 1. From the standpoints of device properties such as life and the like and of easiness of synthesis of a monomer, y is preferably 0 to 2, more preferably 0 or 1.

Examples of the repeating unit of the above-described formula (4) include units of the following formulae (119 to 126).

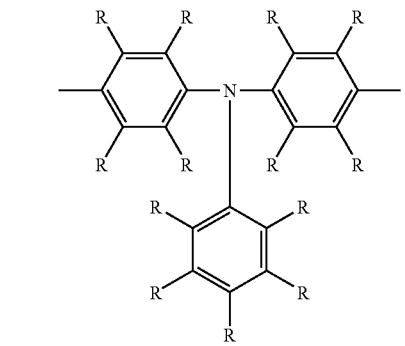
119

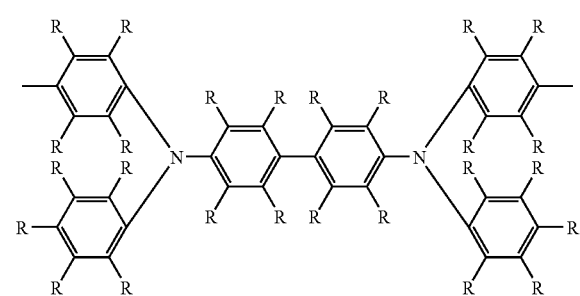
120

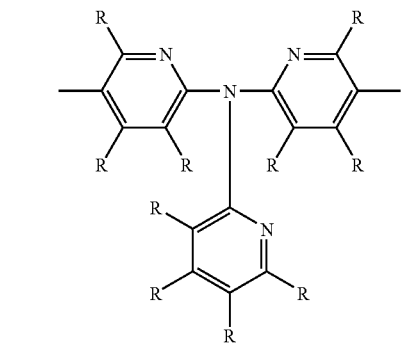
121

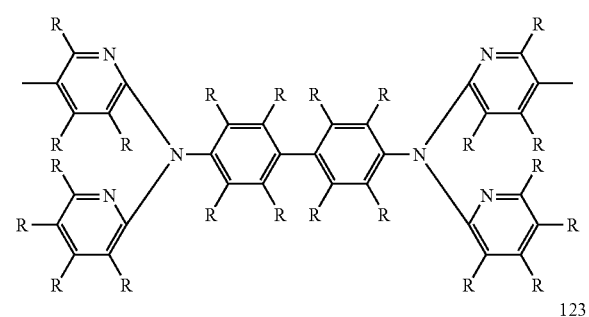
122

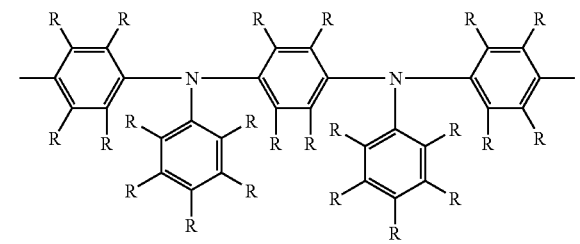
123

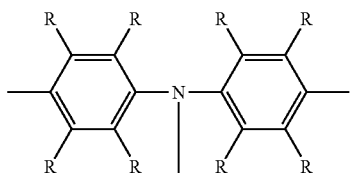
124

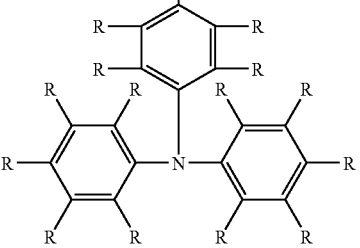
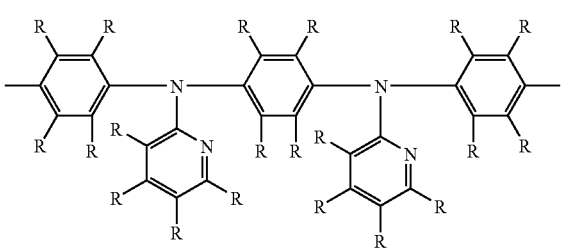
125

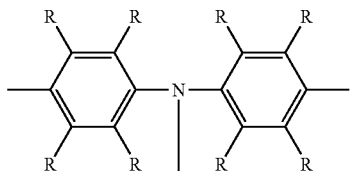
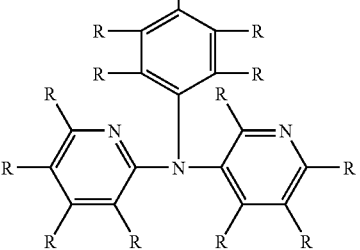
126

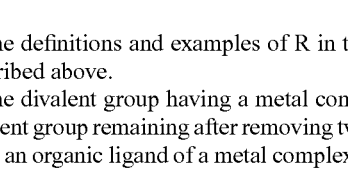

The definitions and examples of R in the formulae are as described above.

The divalent group having a metal complex structure is a divalent group remaining after removing two hydrogen atoms from an organic ligand of a metal complex having an organic ligand.

The organic ligand has a carbon number of usually about from 4 to 60, and examples thereof include 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, and the like.

The center metal of the complex includes, for example, aluminum, zinc, beryllium, iridium, platinum, gold, europium, terbium and the like.

The metal complex having an organic ligand includes metal complexes, triplet light emitting complexes and the like known as fluorescent materials and phosphorescence materials of lower molecular weight.

Examples of the divalent group having a metal complex structure are the following (127 to 133).
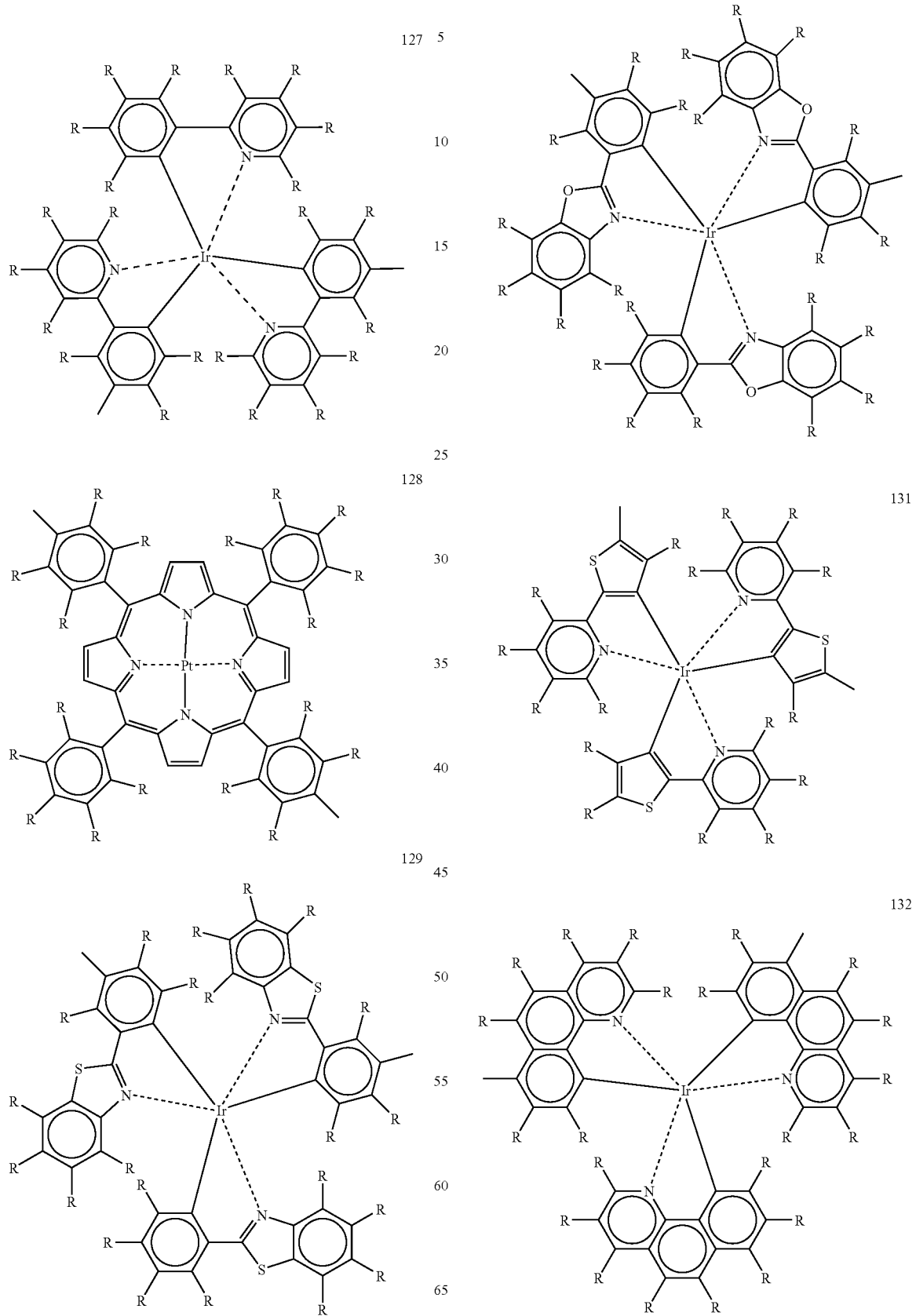

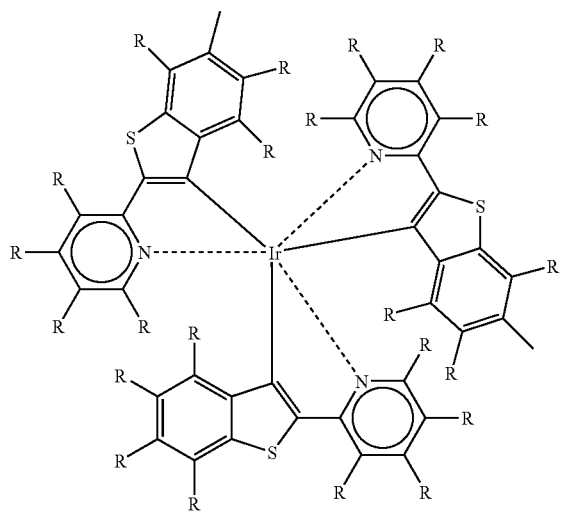

133

The definitions and examples of R in the formulae are as described above.

The copolymer of the present invention may further contains a repeating unit of the following formula (5).

$$—X_1—\qquad(5)$$

In the formula, $X_1$ represents $—CR_5{=}CR_6—$ or $—C{\equiv}C—$. $R_5$ and $R_6$ represent each independently a hydrogen atom, alkyl group, aryl group, monovalent heterocyclic group, carboxyl group, substituted carboxyl group or cyano group. Examples of an alkyl group, aryl group, monovalent heterocyclic group and substituted carboxyl group include the same groups as the above-described examples of $R_1$.

The copolymer of the present invention may contain a repeating unit other than repeating units of the above-mentioned formulae (1) to (5), in a range not deteriorating a light emitting property and charge transporting property. Further, these repeating units and other repeating units may be connected by a non-conjugated unit, or a non-conjugated part may be contained in the repeating unit. As the bonding structure, exemplified are those described below, and combinations of two or more of those described below. Here, R is a group selected from the same substituents as described above, and Ar represents a hydrocarbon group having a carbon number of 6 to 60 which may contain a hetero atom (oxygen, sulfur, nitrogen, silicon, boron, phosphorus, selenium).

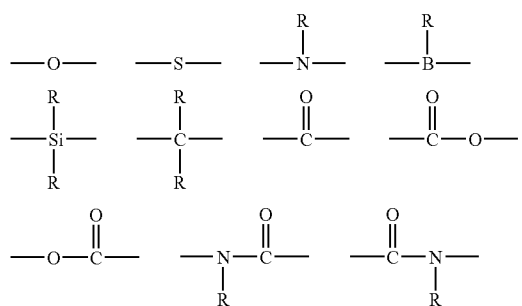

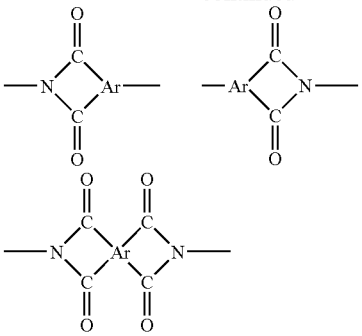

The definitions and examples of R in the formulae are as described above.

The copolymer of the present invention may be a random, block or graft copolymer, or a polymer having an intermediate structure, for example, a random copolymer having a block property. From the standpoint of obtaining a polymer light emitting material having high quantum yield of fluorescence or phosphorescence, a random copolymer having a block property and a block or graft copolymer are more preferable than a complete random copolymer. Those having branching in the main chain and thus having 3 or more end parts, and dendrimers are also included.

The copolymer of the present invention has a polystyrene-reduced number average molecular weight of usually about from $10^3$ to $10^8$, preferably $10^4$ to $10^6$. The polystyrene-reduced weight average molecular weight is usually about from $3\times10^3$ to $10^8$, and from the standpoint of a film forming property and from the standpoint of efficiency in the case of making a device, preferably $5\times10^4$ or more, further preferably $10^5$ or more. From the standpoint of solubility, it is preferably $10^5$ to $5\times10^6$. Copolymers in the preferable range show high efficiency both in the case of single use in a device and in the case of use in combination of two or more in a device. Likewise, from the standpoint of enhancing a film forming property of a polymer compound, the degree of dispersion (weight average molecular weight/number average molecular weight) is preferably 3 or less.

An end group of the copolymer of the present invention is preferably protected by a stable group since when a polymerization active group remains intact, there is a possibility of decrease in light emitting property and life when made into a device. A structure containing a conjugation bond continuous with a conjugation structure of the main chain is preferable, and for example, a structure bonding to an aryl group or heterocyclic group via a carbon-carbon bond is exemplified. Specifically exemplified are substituents described in chemical formula 10 in Japanese Patent Application Laid-Open (JP-A) No. 9-45478, and the like.

In the copolymer of the present invention, it is expected to impart various properties to the copolymer by capping at least one of its molecule chain ends with an aromatic end group selected from monovalent heterocyclic groups, monovalent aromatic amine groups, monovalent groups derived from heterocyclic ring coordination metal complexes and aryl groups. Specifically mentioned are an effect of elongating time necessary for decrease in luminance of a device, an effect of enhancing charge injectability, charge transporting property, light emitting property and the like, an effect of enhancing compatibility and mutual action between copolymers, an anchor-like effect, and the like.

The good solvent for the copolymer of the present invention includes chloroform, methylene chloride, dichloroethane, tetrahydrofuran, toluene, xylene, mesitylene, tetralin, decalin, n-butylbenzene and the like. Depending on the structure and molecular weight of the polymer compound, the polymer compound can be dissolved usually in an amount of 0.1 wt % or more in these solvents.

The copolymer of the present invention shows a fluorescence quantum yield of preferably 50% or more, more preferably 60% or more, further preferably 70% or more, from the standpoints of fluorescence intensity, device properties and the like.

Next, the method for producing a copolymer of the present invention will be described.

A polymer compound having a repeating unit of the formula (1) can be produced, for example, by using a compound of the formula (6) and a compound of the formula (7) as raw materials and polymerizing them.

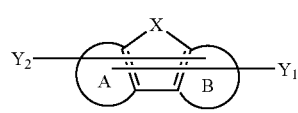

(6)

(wherein, $Y_1$ and $Y_2$ represent a leaving group in the course of polymerization, and are connected to ring A and/or ring B. The ring A, ring B and X are as described above.).

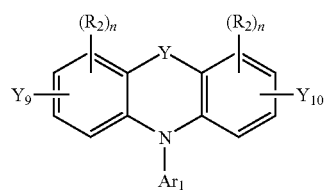

(7)

(wherein, $Y_9$ and $Y_{10}$ represent a leaving group in the course of polymerization. Y, $R_2$, n and $Ar_1$ are as described above.).

By using compounds of the formulae (6-1), (6-2) and (6-3):

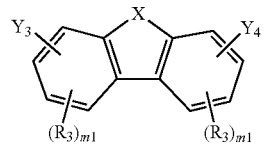

(6-1)

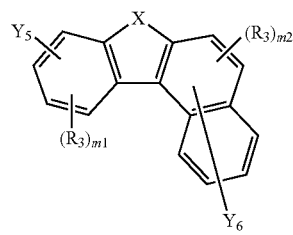

(6-2)

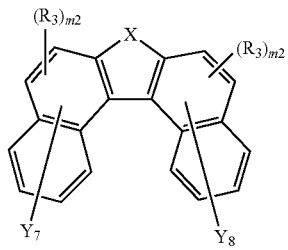

(6-3)

(wherein, $Y_3$, $Y_4$, $Y_5$, $Y_6$, $Y_7$ and $Y_8$ represent a leaving group in the course of polymerization. X, $R_3$, m1 and m2 are as described above.).

as (6), a copolymer having repeating units of the formulae (1-1), (1-2) and (1-3) can be obtained.

Further, by using a compound of the formula (7-1) as (7), a copolymer having a repeating unit of the formula (2-1) can be obtained.

A compound represented by

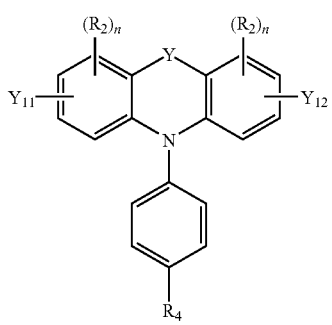

(7-1)

(wherein, $Y_{11}$ and $Y_{12}$ represent a leaving group in the course of polymerization. Y, $R_2$, n and $R_4$ are as described above.). can be polymerized as one of raw materials, to perform production.

When the copolymer of the present invention has a repeating unit other than the above-described formulae (1) and (2), it may be advantageous to carry out polymerization in the co-existence of a compound having two substituents in the course of polymerization, acting as the repeating unit other than the above-described formulae (1) and (2).

Of copolymers of the present invention, the end-capped copolymer can be produced, for example, by carrying out polymerization using compounds of the following formulae (8) and (9), as a raw material, in addition to the above-described formulae (6), (6-1) to (6-3), (7) and (7-1).

$$E_1\text{-}Y_{13} \quad (8)$$

$$E_2\text{-}Y_{14} \quad (9).$$

(E1 and E2 represent a monovalent heterocyclic ring, an aryl group having a substituent, a monovalent aromatic amine group, or a monovalent group derived from a heterocyclic ring coordination metal complex, and $Y_{13}$ and $Y_{14}$ represent each independently a leaving group in the course of polymerization.).

The leaving groups $Y_1$ to $Y_{14}$ in the course of polymerization include halogen atoms, alkylsulfonyloxy groups, arylsulfonyloxy groups, or groups represented by —B(OR$_{11}$)$_2$ (wherein, $R_{11}$ is a hydrogen atom or alkyl group).

Here, mentioned as the halogen atom are a chlorine atom, bromine atom and iodine atom, preferably a chlorine atom and bromine atom, most preferably a bromine atom.

The alkylsulfonyloxy group may be substituted by a fluorine atom, and a trifluoromethanesulfonyloxy group and the like are mentioned.

The arylsulfonyloxy group may be substituted by an alkyl group, and a phenylsulfonyloxy group, trisulfonyloxy group and the like are mentioned.

In the group represented by —B(OR$_{11}$)$_2$, R$_{11}$ is a hydrogen atom or alkyl group. The alkyl group has a carbon number of usually about from 1 to 20, and mentioned are a methyl group, ethyl group, propyl group, butyl group, hexyl group, octyl group, dodecyl group and the like. Alkyl groups may be mutually linked to form a ring.

The group represented by —B(OR$_{11}$)$_2$ includes:

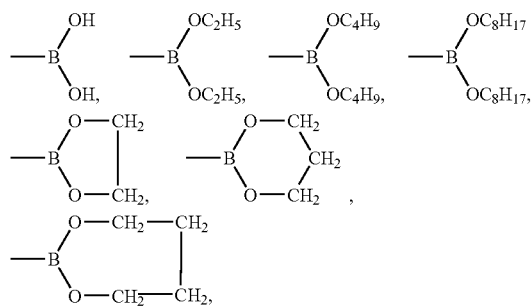

preferably:

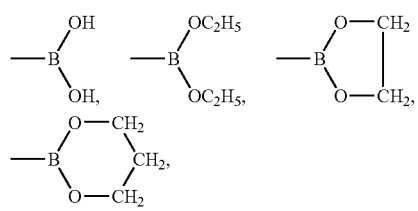

The sum of charging amounts of monomers of the general formulae (8) and (9) is generally 0.1 to 20 mol %, preferably 0.2 to 10 mol %, based on the sum of charging amounts of monomers of the general formulae (6), (6-1) to (6-3), (7) and (7-1).

As the method for producing a copolymer of the present invention, there are exemplified a method of using the above-described corresponding monomer and polymerizing by the Suzuki reaction (Chem. Rev., vol. 95, p. 2457 (1995)), a method of polymerization by the Grignard reaction (Kyoritsu Publication, Kobunshi Kino Zairyo Series vol. 2, Kobunshi no Gosei to Hanno (2), p. 432-3), a method of polymerization by the Yamamoto Polymerization Method (Prog. Polym. Sci., vol. 17, p. 1153-1205, 1992), a method of polymerization with an oxidizer such as FeCl$_3$ and the like, a method of electrochemical oxidation-polymerization (Maruzen, Jikken Kagaku Koza 4-th edition, vol. 28, p. 339-340), and the like.

The case of using the Suzuki reaction will be illustrated. In this case, for example, monomers in which Y$_1$ and Y$_2$ are each independently a group represented by —B(OR$_{11}$)$_2$ (wherein, R$_{11}$ is a hydrogen atom or alkyl group), Y$_3$ and Y$_4$ are each independently a halogen atom, alkylsulfonyloxy group or arylsulfonyloxy group, Y$_7$ is a group represented by —B(OR$_{11}$)$_2$ (wherein, R$_{11}$ is a hydrogen atom or alkyl group), and Y$_8$ is a halogen atom, alkylsulfonyloxy group or arylsulfonyloxy group are used, and these monomers are reacted in the presence of a Pd(0) catalyst, thus, the copolymer can be produced.

In this case, in the reaction requiring that at least one monomer is a monomer having two groups represented by —B(OR$_{11}$)$_2$ (wherein, R$_{11}$ is a hydrogen atom or alkyl group) and at least one monomer is a monomer having two halogen atoms, alkylsulfonyloxy groups or arylsulfonyloxy groups, among two or more monomers having two leaving groups to be subjected to the reaction, it is usual that monomers of the general formulae (6), (6-1) to (6-3), (7) and (7-1) are reacted for about from 1 to 100 hours, subsequently, a monomer (9) is added into the system and reacted for about from 0.5 to 50 hours, then, a monomer (8) is added into the system and reacted for about from 0.5 to 50 hours.

The Pd(0) catalyst includes, for example, palladium[tetrakis(triphenylphosphine)], palladium acetates (for example, catalyst system obtained by reducing palladium acetate with a triphenylphosphine derivative) and the like, and an inorganic base such as potassium carbonate, sodium carbonate, barium hydroxide and the like, an organic base such as triethylamine and the like, and an inorganic salt such as cesium fluoride and the like are added in an amount of equivalent or more, preferably from 1 to 10 equivalents based on the monomers, and reacted. The inorganic salt may be used in the form of solution and reacted in a two-phase system. The examples of the solvent include N,N-dimethylformamide, toluene, dimethoxyethane, tetrahydrofuran and the like. Depending on the solvent, temperatures of about from 50 to 160° C. are suitably used. It may also be permissible to increase the temperature up to around the boiling point of a solvent and to carry out reflux. The polymerization reaction is carried out usually in a reaction system causing no deactivation of the Pd(0) catalyst under an inert gas atmosphere such as argon, nitrogen and the like.

The case of using the Yamamoto polymerization reaction will be illustrated. In this case, for example, monomers in which Y$_1$, Y$_2$, Y$_3$, Y$_4$, Y$_7$ and Y$_8$ are each independently a halogen atom, alkylsulfonyloxy group or arylsulfonyloxy group are used, and these monomers are reacted in the presence of a Ni(0) complex, thus, the copolymer can be produced.

In carrying out the reaction, it is usual to mix all monomers (6), (6-1) to (6-3), (7), (7-1), (8) and (9).

The polymerization is carried out in the presence of a Ni(0) complex (zerovalent nickel complex). Methods of using the nickel complex include a method of using a zerovalent nickel as it is and a method of reacting a nickel salt in the presence of a reducing agent to produce zerovalent nickel in the system and reacting this.

Examples of the zerovalent nickel complex include bis(1,5-cyclooctadiene)nickel(0), (ethylene)bis(triphenylphosphine)nickel(0), tetrakis(triphenylphosphine)nickel and the like, and of them, bis(1,5-cyclooctadiene)nickel(0) is preferable from the standpoints of general versatility and cheap price.

Addition of a neutral ligand is preferable from the standpoint of improvement in yield.

Here, the neutral ligand is a ligand having no anion and cation, and exemplified are nitrogen-containing ligands such as 2,2'-bipyridyl, 1,10-phenanthroline, methylenebisoxazoline, N,N'-tetramethylethylenediamine and the like; tertiary phosphine ligands such as triphenylphosphine, tritolylphosphine, tributylphosphine, triphenoxyphosphine and the like, and nitrogen-containing ligands are preferable from the standpoints of general versatility and cheap price, and 2,2'-bipyridyl is particularly preferable from the standpoints of high reactivity and high yield.

Particularly, a system obtained by adding 2,2'-bipyridyl as a neutral ligand to a system containing bis(1,5-cyclooctadiene)nickel(0) is preferable from the standpoint of improvement in yield of a polymer. In the method of reacting zerovalent nickel in the system, mentioned as the nickel salt are nickel chloride, nickel acetate and the like. The reducing agent includes zinc, sodium hydride, hydrazine and derivatives thereof, lithium aluminum hydride and the like, and if necessary, ammonium iodide, lithium iodide, potassium iodide and the like are used as an additive.

The polymerization solvent is not particularly restricted providing it does not disturb polymerization, and preferable are those containing at least one aromatic hydrocarbon solvent and/or ether solvent.

Here, examples of the aromatic hydrocarbon solvent include benzene, toluene, xylene, trimethylbenzene, tetramethylbenzene, butylbenzene, naphthalene, tetralin and the like, and preferable are toluene, xylene, tetralin and tetramethylbenzene.

Examples of the ether solvent include diisopropyl ether, tetrahydrofuran, 1,4-dioxane, diphenyl ether, ethylene glycol dimethyl ether, tert-butyl methyl ether and the like, and tetrahydrofuran, 1,4-dioxane and the like as a good solvent for a polymer compound are preferable. Of the solvents, tetrahydrofuran is most preferable.

From the standpoint of improvement in polymerizability and solubility, mixed solvents of aromatic hydrocarbon solvents and/or ether solvents with other solvents than aromatic hydrocarbon solvents and ether solvents may also be used as the solvent, providing they do not disturb the polymerization reaction.

The reaction operations and the like can be carried out according to a method described, for example, in JP-A No. 2000-44544.

In the Yamamoto polymerization method, the polymerization reaction is carried out, for example, in the presence of a zerovalent nickel complex and a neutral ligand at a temperature of 60° C. in a tetrahydrofuran solvent, usually, under an inert gas atmosphere such as argon, nitrogen and the like. The polymerization temperature is usually about from 0 to 200° C., and from the standpoints of high yield and low heating cost, preferably 20 to 100° C.

In the case of use of a neutral ligand, its use amount is preferably about from 0.5 to 10 mol, more preferably 0.8 to 1.5 mol, further preferably 0.9 to 1.1 mol from the standpoints of reaction yield and cost.

The use amount of the zerovalent nickel complex is not particularly restricted providing it does not disturb the polymerization reaction, and when the use amount is too small, there is a tendency of low molecular weight and when the use amount is too large, there is a tendency of complicated post treatment. Thus, the use amount is preferably 0.1 to 10 mol, more preferably 1 to 5 mol, further preferably 1.7 to 3.5 mol per mol of a monomer.

When the copolymer of the present invention is used in a polymer LED and the like, its purity exerts an influence on performances of a device such as a light emitting property and the like, therefore, it is preferable to purify a monomer before polymerization by a method such as distillation, sublimation purification, re-crystallization and the like before effecting polymerization. It is preferable, after polymerization, to carry out a refinement treatment such as re-precipitation purification, chromatographic fractionation and the like. Among polymer compounds of the present invention, those produced by the method of polymerization with a nickel zerovalent complex are preferable from the standpoints of the life of a polymer LED, device properties such as light emission initiation voltage, current density, voltage increase in driving and the like, or heat resistance and the like.

The polymer composition of the present invention is characterized by containing at least one material selected from hole transporting materials, electron transporting materials and light emitting materials, and a copolymer of the present invention. The content ratio of at least one material selected from hole transporting materials, electron transporting materials and light emitting materials to a copolymer of the present invention may be advantageously determined according to the application.

As the hole transporting material, electron transporting material and light emitting material to be mixed, known low molecular weight compounds, triplet light emitting complexes or polymer compounds can be used, and polymer compounds are preferably used.

Examples of the hole transporting material, electron transporting material and light emitting material as polymer compounds include polyfluorene, its derivatives and copolymers, polyarylene, its derivatives and copolymers, polyarylenevinylene, its derivatives and copolymers, and (co)polymers of aromatic amine and its derivatives disclosed in WO 99/13692, WO 99/48160, GB 2340304A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP 0707020, WO 95/07955, JP-A No. 2001-181618, JP-A No. 2001-123156, JP-A No. 2001-3045, JP-A No. 2000-351967, JP-A No. 2000-303066 JP-A No. 2000-299189, JP-A No. 2000-252065, JP-A No. 2000-136379, JP-A No. 2000-104057, JP-A No. 2000-80167, JP-A No. 10-324870, JP-A No. 10-114891, JP-A No. 9-111233, JP-A No. 9-45478 and the like.

The fluorescent material of a low molecular weight compound include, for example, naphthalene derivatives, anthracene or derivatives thereof, perylene or derivatives thereof; coloring matters such as polymethine, xanthene, coumarin, cyanine and the like; metal complexes of 8-hydroxyquinoline or derivatives thereof; aromatic amines, tetraphenylcyclopentadiene or derivatives thereof, tetraphenylbutadiene or derivatives thereof, and the like.

Specifically, known compounds such as those described in, for example, JP-A Nos. 57-51781 and 59-194393, and the like, can be used. The triplet light emitting complex includes, for example, Ir(ppy)3, Btp$_2$Ir(acac) containing iridium as a center metal, PtOEP containing platinum as a center metal, Eu(TTA)$_3$phen containing europium as a center metal, and the like.

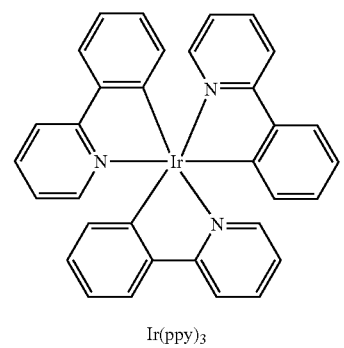

Ir(ppy)$_3$

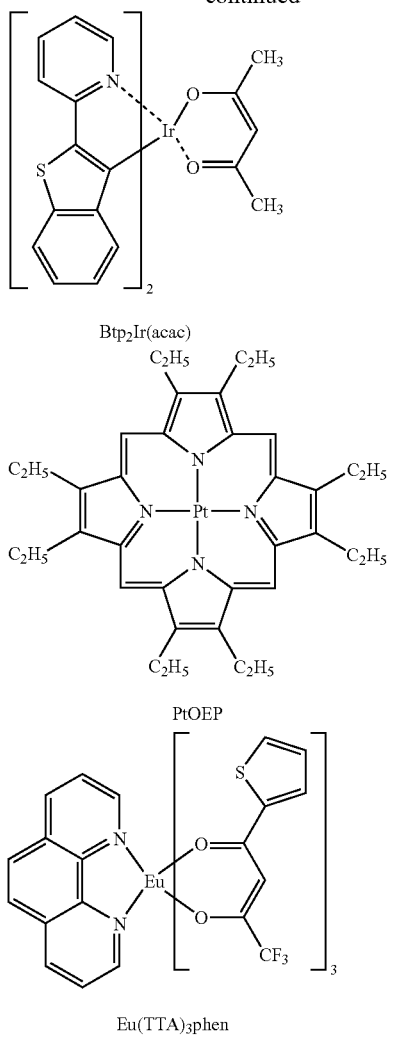

Btp₂Ir(acac)

PtOEP

Eu(TTA)₃phen

The triplet light emitting complex is described, for example, in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Jpn. J. Appl. Phys., 34, 1883 (1995), and the like.

Next, the solution of the present invention will be explained. A thin film for polymer LED can be formed by a printing method and the like using the solution (ink composition) of the present invention. The solution of the present invention may advantageously contain at least one copolymer of the present invention, and may also contain additives such as a hole transporting material, electron transporting material, light emitting material, solvent, stabilizer and the like, in addition to the copolymer of the present invention.

The ratio of a copolymer of the present invention in the ink composition is usually 20 wt % to 100 wt %, preferably 40 wt % to 100 wt % based on the total weight of the composition excluding a solvent.

The ratio of a solvent in the ink composition is 1 wt % to 99.9 wt %, preferably 60 wt % to 99.5 wt %, further preferably 80 wt % to 99.0 wt % based on the total weight of the composition.

Though the viscosity of an ink composition varies depending on a printing method, when an ink composition passes through a discharge apparatus such as in an inkjet print method and the like, the viscosity at 25° C. is preferably in a range of 2 to 20 mPa·s, more preferably in a range of 5 to 20 mPa·s, further preferably in a range of 7 to 20 mPa·s, for preventing clogging and flying curving in discharging.

The solution of the present invention may contain additives for regulating viscosity and/or surface tension in addition to the polymer compound of the present invention. As the additive, a polymer compound (thickening agent) having high molecular weight for enhancing viscosity and a poor solvent, a compound of low molecular weight for lowering viscosity, a surfactant for decreasing surface tension, and the like may be appropriately combined and used.

As the above-mentioned polymer compound having high molecular weight, a compound which is soluble in the same solvent as for the polymer compound of the present invention and which does not disturb light emission and charge transportation may be used. For example, polystyrene of high molecular weight, polymethyl methacrylate, polymer compounds of the present invention having larger molecular weights, and the like can be used. It is also possible to use a poor solvent as a thickening agent. That is, by adding a small amount of poor solvent for solid components in a solution, viscosity can be enhanced. When a poor solvent is added for this purpose, the kind and addition amount of the solvent may be advantageously selected within a range not causing deposition of solid components in a solution.

When stability in preservation is taken into consideration, the amount of a poor solvent is preferably 50 wt % or less, further preferably 30 wt % or less based on the whole solution.

The solution of the present invention may contain an antioxidant in addition to the copolymer of the present invention for improving preservation stability. As the antioxidant, a compound which is soluble in the same solvent as for the copolymer of the present invention and which does not disturb light emission and charge transportation is permissible, and exemplified are phenol-based antioxidants, phosphorus-based antioxidants and the like.

As the solvent contained in the solution of the present invention, compounds which can dissolve or uniformly disperse the copolymer of the present invention are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more. Among the above-mentioned solvents, at least one organic solvent having a structure containing at least one benzene ring and having a melting point of 0° C. or lower and a boiling point of 100° C. or higher is preferably contained.

Regarding the kind of the solvent, preferable are aromatic hydrocarbon solvents, aliphatic hydrocarbon solvents, ester solvents and ketone solvents from the standpoints of solubility in an organic solvent, uniformity in film formation, viscosity property and the like.

The number of the kind of the solvent in a solution is preferably 2 or more, from the standpoint of a film forming property and from the standpoint of device properties and the like.

The polymer compound of the present invention to be contained in a solution may be used singly or in combination of two or more, and a polymer compound other than the polymer compound of the present invention may be contained in a range not deteriorating device properties and the like.

The solution of the present invention may contain water, metal and its salt in an amount of 1 to 1000 ppm. As the metal, lithium, sodium, calcium, potassium, iron, copper, nickel, aluminum, zinc, chromium, manganese, cobalt, platinum, iridium and the like are specifically mentioned. Further, silicon, phosphorus, fluorine, chlorine or bromine may be contained in an amount of 1 to 1000 ppm.

Using the solution of the present invention, a thin film can be formed by a spin coat method, casting method, micro gravure coat method, gravure coat method, bar coat method, roll coat method, wire bar coat method, dip coat method, spray coat method, screen printing method, flexo printing method, offset printing method, inkjet printing method and the like. Particularly, the solution of the present invention is preferably used for film formation by a screen printing method, flexo printing method, offset printing method or inkjet printing method, and more preferably used for film formation by an inkjet method.

Next, the thin film of the present invention will be illustrated. As the kind of the thin film, a light emitting thin film, electrically conductive thin film and organic semiconductor thin film are exemplified.

The light emitting thin film shows a light emission quantum yield of preferably 50% or more, more preferably 60% or more, further preferably 70% or more from the standpoints of the luminance of a device, light emission voltage thereof and the like.

The electrically conductive thin film preferably has a surface resistance of 1 KΩ/□ or less. By doping a thin film with a Lewis acid, ionic compound or the like, electric conductivity can be enhanced. The surface resistance is preferably 100Ω/□ or less, further preferably 10Ω/□ or less.

In the organic semiconductor thin film, one larger parameter of electron mobility or hole mobility is preferably $10^{-5}$ cm$^2$/V/s or more. More preferably, it is $10^{-3}$ cm$^2$/V/s or more, and further preferably $10^{-1}$ cm$^2$/V/s or more.

By forming the organic semiconductor thin film on a Si substrate carrying a gate electrode and an insulation film of SiO$_2$ and the like formed thereon, and forming a source electrode and a drain electrode with Au and the like, an organic transistor can be obtained.

Using the organic semiconductor thin film, an organic transistor can be manufactured.

Next, applications of the copolymer of the present invention will be illustrated.

The copolymer of the present invention usually emits fluorescence or phosphorescence at solid state, and can be used as a polymer light emitter (light emitting material of high molecular weight).

This polymer compound has an excellent charge transporting ability, and can be used suitably as a polymer LED material or charge transporting material. The polymer LED using this polymer light emitter is a high performance polymer LED which can be driven at low voltage with high efficiency. Therefore, the polymer LED can be preferably used for back light of a liquid crystal display, curved or plane light source for illumination, segment type display, flat panel display of dot matrix, and the like.

The polymer compound of the present invention can also be used as a coloring matter for laser, organic solar battery material, and conductive thin film material such as an organic semiconductor for organic transistor, conductive thin film, organic semiconductor thin film and the like.

Further, it can be used also as a light emitting thin film material which emits fluorescence or phosphorescence.

Next, the polymer LED of the present invention will be illustrated.

The polymer LED of the present invention is characterized in that an organic layer is present between electrodes composed of an anode and a cathode and the organic layer contains a copolymer of the present invention.

The organic layer (layer containing organic substance) may be a light emitting layer, hole transporting layer, electron transporting layer and the like, and the organic layer is preferably a light emitting layer.

Here, the light emitting layer means a layer having a function of light emission, the hole transporting layer means a layer having a function of transporting holes, and the electron transporting layer means a layer having a function of transporting electrons. The electron transporting layer and hole transporting layer are generically called a charge transporting layer. Two or more light emitting layers, two or more hole transporting layers and two or more electron transporting layers may be used each independently.

When the organic layer is a light emitting layer, the light emitting layer as an organic layer may further contain a hole transporting material, electron transporting material or light emitting material. Here, the light emitting material means a material showing fluorescence and/or phosphorescence.

When the copolymer of the present invention and a hole transporting material are mixed, the mixing ratio of the hole transporting material based on the whole mixture is 1 wt % to 80 wt %, preferably 5 wt % to 60 wt %. When the polymer material of the present invention and an electron transporting material are mixed, the mixing ratio of the electron transporting material based on the whole mixture is 1 wt % to 80 wt %, preferably 5 wt % to 60 wt %. Further, when the polymer compound of the present invention and a light emitting material are mixed, the mixing ratio of the light emitting material based on the whole mixture is 1 wt % to 80 wt %, preferably 5 wt % to 60 wt %. When the polymer compound of the present invention and a light emitting material, hole transporting material and/or electron transporting material are mixed, the mixing ratio of the light emitting material based on the whole mixture is 1 wt % to 50 wt %, preferably 5 wt % to 40 wt %, the ratio of the sum the hole transporting material and electron transporting material is 1 wt % to 50 wt %, preferably 5 wt % to 40 wt %, and the content of the polymer compound of the present invention is 99 wt % to 20 wt %.

The thickness of a light emitting layer in the polymer LED of the present invention shows optimum value varying depending on the material to be used, and may be advantageously selected so as to give optimum driving voltage and optimum light emission efficiency, and it is, for example, 1 nm to 1 µm, preferably 2 nm to 500 nm, further preferably 5 nm to 200 nm.

As the method for forming a light emitting layer, a method of film formation from a solution is exemplified. As the film formation method from a solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used. Printing methods such as a screen printing method, flexo printing method, offset printing method, inkjet printing method and the like are preferable since pattern formation and multicolor separate painting are easy.

In the polymer light emitting device of the present invention, the maximum external quantum yield when a voltage of 3.5 V or more is applied between an anode and a cathode is preferably 1% or more, more preferably 1.5% or more from the standpoint of the luminance of a device and the like.

A polymer light emitting device (hereinafter, referred to as polymer LED) of the present invention includes, for example mentioned are a polymer LED having an electron transporting layer provided between a cathode and a light emitting layer, a polymer LED having a hole transporting layer provided between an anode and a light emitting layer, a polymer LED having an electron transporting layer provided between a cathode and a light emitting layer and having a hole transporting layer provided between an anode and a light emitting layer, and the like.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / means adjacent lamination of layers, applied also in the followings)

The polymer LED of the present invention includes also those in which a polymer compound of the present invention is contained in a hole transporting layer and/or electron transporting layer.

When the polymer compound of the present invention is used in a hole transporting layer, it is preferable that the polymer compound of the present invention is a polymer compound containing a hole transporting group, and examples thereof include copolymers with an aromatic amine, copolymers with stilbene, and the like.

When the polymer compound of the present invention is used in an electron transporting layer, it is preferable that the polymer compound of the present invention is a polymer compound containing an electron transporting group, and examples thereof include copolymers with oxadiazole, copolymers with triazole, copolymers with quinoline, copolymers with quinoxaline, copolymers with benzothiazole, and the like.

When the polymer LED of the present invention has a hole transporting layer, exemplified as the hole transporting material to be used are polyvinylcarbazole or its derivative, polysilane or its derivative, polysiloxane derivative having an aromatic amine on the side chain or main chain, pyrazoline derivative, arylamine derivative, stilbene derivative, triphenyldiamine derivative, polyaniline or its derivative, polythiophene or its derivative, polypyrrole or its derivative, poly(p-phenylenevinylene) or its derivative, poly(2,5-thienylenevinylene) or its derivative, and the like.

Examples of the hole transporting material include those described in JP-A Nos. 63-70257, 63-175860, 2-135359, 2-135361, 2-209988, 3-37992 and 3-152184, and the like.

Among them, preferable as the hole transporting material used in a hole transporting layer are polymer hole transporting materials such as polyvinylcarbazole or its derivative, polsilane or its derivative, polysiloxane derivative having an aromatic amine compound group on the side chain or main chain, polyaniline or its derivative, polythiophene or its derivative, poly(p-phenylenevinylene) or its derivative, poly(2,5-thienylenevinylene) or its derivative, and the like, and polyvinylcarbazole or its derivative, polsilane or its derivative, polysiloxane derivative having an aromatic amine on the side chain or main chain are further preferable.

Examples of the hole transporting material of low molecular weight compound include pyrazoline derivative, arylamine derivative, stilbene derivative and triphenyldiamine derivative. In the case of the hole transporting material of low molecular weight, it is preferably dispersed in a polymer binder in use.

The polymer binder to be mixed is preferably that which does not extremely disturb charge transportation, and those showing not strong absorption against visible ray are suitably used. Examples of the polymer binder include poly(N-vinylcarbazole), polyaniline or its derivative, polythiophene or its derivative, poly(p-phenylenevinylene) or its derivative, poly(2,5-thienylenevinylene) or its derivative, polycarbonate, polyacrylate, polymethyl acrylate, polymethyl methacrylate, polystyrene, polyvinyl chloride, polysiloxane and the like.

Polyvinylcarbazole or its derivative can be obtained, for example, from a vinyl monomer by cation polymerization or radical polymerization.

As the polysilane or its derivative, compounds described in Chem. Rev., vol. 89, p. 1359 (1989), GB Patent No. 2300196 publication, and the like are exemplified. Also as the synthesis method, methods described in them can be used, and particularly, the Kipping method is suitably used.

In the polysiloxane or its derivative, the siloxane skeleton structure shows little hole transporting property, thus, those having the structure of the above-mentioned hole transporting material of low molecular weight on the side chain or main chain are suitably used Particularly, those having an aromatic amine showing a hole transporting property on the side chain or main chain are exemplified.

The film formation method of a hole transporting layer is not particularly restricted, and in the case of a hole transporting material of low molecular weight, a method of film formation from a mixed solution with a polymer binder is exemplified. In the case of a hole transporting material of high molecular weight, a method of film formation from a solution is exemplified.

As the solvent used for film formation from a solution, those which can dissolve or uniformly disperse a hole transporting material are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

The thickness of a hole transporting layer shows an optimum value varying depending on a material to be used, and may be advantageously selected so as to give a suitable driving voltage value and suitable light emission efficiency, and a thickness at least causing no formation of pin holes is necessary, and too large thickness is not preferable since then the driving voltage of a device increases. Therefore, the thickness of the hole transporting layer is, for example, 1 nm to 1 μm, preferably 2 nm to 500 nm, further preferably 5 nm to 200 nm.

When the polymer LED of the present invention has an electron transporting layer, known materials can be used as the electron transporting material to be used, and exemplified are oxadiazole derivative, anthraquinodimethane or its derivative, benzoquinone or its derivative, naphthoquinone or its derivative, anthraquinone or its derivative, tetracyanoanthraquinodimethane or its derivative, fluorenone derivative, diphenyldicyanoethylene or its derivative, diphenoquinone derivative, metal complex of 8-hydroxyquinoline or its derivative, polyquinoline or its derivative, polyquinoxaline or its derivative, polyfluorene or its derivative, and the like.

Specifically, those described in JP-A Nos. 63-70257, 63-175860, 2-135359, 2-135361, 2-209988, 3-37992, 3-152184, and the like are exemplified.

Of them, oxadiazole derivative, benzoquinone or its derivative, anthraquinone or its derivative, metal complexes of 8-hydroxyquinoline or its derivative, polyquinoline or its derivative, polyquinoxaline or its derivative, polyfluorene or its derivative are preferable, and 2-(4-biphenyl)-1)-5-(4-t-butylphenyl)-1,3,4-oxadiazole, benzoquinone, anthraquinone, tris(8-quinolinol)aluminum and polyquinoline are further preferable.

The film formation method of an electron transporting layer is not particularly restricted, and in the case of an electron transporting material of low molecular weight, exemplified are a vacuum vapor-deposition method from powder, film formation methods from solution or melted conditions, and in the case of an electron transporting material of high molecular weight, film formation methods from solution or melted condition are exemplified, respectively. In film formation from solution or melted condition, the above-mentioned polymer binder may be used together.

As the solvent used in film formation from solution, compounds which can dissolve or uniformly disperse an electron transporting material and/or polymer binder are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

The polymer compound of the present invention can also be used as a polymer electric field effect transistor. In the structure of the polymer electric field effect transistor, it may be usually advantageous that a source electrode and a drain electrode are placed next to an active layer composed of a polymer, further, a gate electrode is provided sandwiching an insulating layer next to the active layer.

The polymer electric field effect transistor is usually formed on a supporting substrate. The material of the supporting substrate is not particularly restricted providing it does not disturb a property as an electric field effect transistor, and a glass substrate, flexile film substrate and plastic substrate can also be used.

The electric field effect transistor can be produced by known methods, for example, a method described in JP-A No. 5-110069.

In forming an active layer, it is very advantageously preferable to use a polymer soluble in an organic solvent from the standpoint of production. As the film formation method from a solution prepared by dissolving a polymer in an organic solvent, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

Preferable is a sealed polymer electric field effect transistor obtained by producing a polymer electric field effect transistor and then, sealing this. By this, the polymer electric field effect transistor is blocked from atmospheric air, and lowering of the property of a polymer electric field transistor can be suppressed.

As the sealing method, a method of covering with a UV hardening resin, thermosetting resin, inorganic SiONx film and the like, a method of pasting a glass plate or film with a UV hardening resin, thermosetting resin and the like, are mentioned. It is preferable that a process after manufacturing of a polymer electric field effect transistor until sealing is carried out without exposing to atmospheric air (for example, in a dried nitrogen atmosphere, in vacuum, and the like), for effectively performing blocking from atmospheric air.

The thickness of an electron transporting layer shows an optimum value varying depending on a material to be used, and may be advantageously selected so as to give a suitable driving voltage value and suitable light emission efficiency, and a thickness at least causing no formation of pin holes is necessary, and too large thickness is not preferable since then the driving voltage of a device increases. Therefore, the thickness of the electron transporting layer is, for example, 1 nm to 1 µm, preferably 2 nm to 500 nm, further preferably 5 nm to 200 nm.

Among charge transporting layers placed next to an electrode, those having a function of improving a charge injecting efficiency from an electrode and having an effect of lowering the driving voltage of a device are, in particularly, called generally a charge injection layer (hole injection layer, electron injection layer) in some cases.

Further, for improving close adherence with an electrode or improving charge injection from an electron, the above-mentioned charge injection layer or an insulation layer having a thickness of 2 nm or less may be placed next to the electrode, alternatively, for improving close adherence of an interface or preventing mixing, a thin buffer layer may be inserted into an interface of a charge transporting layer and a light emitting layer.

The order and number of layers to be laminated, and thickness of each layer can be appropriately determined in view of light emission efficiency and device life.

In the present invention, as the polymer LED carrying a charge injection layer provided thereon (electron injection layer, hole injection layer), mentioned are a polymer LED having a charge injection layer placed next to a cathode and a polymer LED having a charge injection layer next to an anode.

For example, the following structures e) to p) are specifically mentioned.

e) anode/hole injection layer/light emitting layer/cathode
f) anode/light emitting layer/electron injection layer/cathode
g) anode/hole injection layer/light emitting layer/electron injection layer/cathode
h) anode/hole injection layer/hole transporting layer/light emitting layer/cathode
i) anode/hole injection layer/light emitting layer/electron injection layer/cathode
j) anode/hole injection layer/hole transporting layer/light emitting layer/electron injection layer/cathode
k) anode/hole injection layer/light emitting layer/electron transporting layer/cathode
l) anode/light emitting layer/electron transporting layer/electron injection layer/cathode
m) anode/hole injection layer/light emitting layer/electron transporting layer/electron injection layer/cathode
n) anode/hole injection layer/hole transporting layer/light emitting layer/electron transporting layer/cathode
o) anode/hole transporting layer/light emitting layer/electron transporting layer/electron injection layer/cathode
p) anode/hole injection layer/hole transporting layer/light emitting layer/electron transporting layer/electron injection layer/cathode The polymer LED of the present invention includes also those in which a polymer compound of the present invention is contained in a hole transporting layer and/or electron transporting layer, as described above.

The polymer LED of the present invention includes also those in which a polymer compound of the present invention is contained in a hole injection layer and/or electron injection layer. When a polymer compound of the present invention is used in a hole injection layer, it is preferable that the polymer compound is used simultaneously with an electron receptive compound. When a polymer compound of the present invention is used in an electron transporting layer, it is preferable that the polymer compound is used simultaneously with an electron donating compound. Here, for simultaneous use, there are methods such as mixing, copolymerization, introduction as a side chain, and the like.

As examples of the charge injection layer, exemplified are a layer containing an electric conductive polymer, a layer provided between an anode and a hole transporting layer and containing a material having ionization potential of a value between an anode material and a hole transporting material contained in a hole transporting layer, a layer provided between a cathode and an electron transporting layer and containing a material having electron affinity of a value between a cathode material and an electron transporting material contained in an electron transporting layer, and the like.

When the above-mentioned charge injection layer contains an electric conductive polymer, the electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less.

When the above-mentioned charge injection layer contains an electric conductive polymer, the electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less.

Usually, for controlling the electric conductivity of the electric conductive polymer to $10^{-5}$ S/cm or more and $10^3$ or less, the electric conductive polymer is doped with a suitable amount of ions.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the electron injection layer may be appropriately selected depending on a relation with the materials of an electrode and an adjacent layer, and exemplified are polyaniline or its derivative, polythiophene or its derivative, polypyrrole and its derivative, polyphenylenevinylene and its derivative, polythienylenevinylene and its derivative, polyquinoline and its derivative, polyquinoxaline and its derivative, electric conductive polymers such as a polymer containing an aromatic amine structure on the side chain or main chain, metal phthalocyanine (copper phthalocyanine and the like), carbon and the like.

An insulation layer having a thickness of 2 nm or less has a function of making charge injection easier. As the material of the above-mentioned insulation layer, a metal fluoride, metal oxide, organic insulating material and the like are mentioned. As the polymer LED carrying an insulation layer having a thickness of 2 nm or less provided thereon, there are mentioned a polymer LED in which an insulation layer having a thickness of 2 nm or less is provided next to a cathode, and a polymer LED in which an insulation layer having a thickness of 2 nm or less is provided next to an anode.

Specifically, the following structures q) to ab) are mentioned, for example.

q) anode/insulation layer having a thickness of 2 nm or less/light emitting layer/cathode
r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode The polymer LED of the present invention includes those having a device structure as exemplified in the above-mentioned a) to ab) in which a polymer compound of the present invention is contained in any one of the hole injection layer, hole transporting layer, light emitting layer, electron transporting layer and electron injection layer.

The substrate forming a polymer LED of the present invention may advantageously be one which forms an electrode and does not change in forming a layer of an organic substance, and examples thereof include glass, plastic, polymer film and silicon substrates and the like. In the case of an opaque substrate, it is preferable that the opposite electrode is transparent or semi-transparent.

Usually, at least one of an anode and a cathode in a polymer LED of the present invention is transparent or semi-transparent. It is preferable that a cathode is transparent or semi-transparent.

As the material of the cathode, an electrically conductive metal oxide film, semi-transparent metal membrane and the like are used. Specifically, films (NESA and the like) formed using electrically conductive glass composed of indium oxide, zinc oxide, tin oxide, and composite thereof: indium-.tin.oxide (ITO), indium.zinc.oxide and the like, and gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electrically conductive films made of polyaniline or its derivative, polythiophene or its derivative, and the like may be used.

The thickness of an anode can be appropriately selected in view of light transmission and electric conductivity, and it is, for example, from 10 nm to 10 μm, preferably 20 nm to 1 μm, further preferably 50 nm to 500 nm.

For making charge injection easier, a layer made of a phthalocyanine derivative, electrically conductive polymer, carbon and the like, or a layer having an average thickness of 2 nm or less made of a metal oxide, metal fluoride, organic insulation material and the like, may be provided on an anode.

As the material of a cathode used in a polymer LED of the present invention, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of them, or alloys made of at least one of them and at least one of gold, silver, platinum, copper, manganese, titanium, cobalt, nickel, tungsten and tin, and graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure including two or more layers.

The thickness of a cathode can be appropriately selected in view of electric conductivity and durability, and it is, for example, from 10 nm to 10 μm, preferably 20 nm to 1 μm, further preferably 50 nm to 500 nm.

As the cathode manufacturing method, a vacuum vapor-deposition method, sputtering method, lamination method of thermally press-bonding a metal thin film, and the like are used. A layer made of an electrically conductive polymer, or a layer having an average thickness of 2 nm or less made of a metal oxide, metal fluoride, organic insulation material and the like, may be provided between a cathode and an organic substance layer, and after manufacturing a cathode, a protective layer for protecting the polymer LED may be installed. For use of the polymer LED stably for a long period of time, it is preferable to install a protective layer and/or protective cover, for protecting a device from outside.

As the protective layer, polymer compounds, metal oxides, metal fluorides, metal borides, metal nitrides, organic and inorganic hybrid materials and the like can be used. As the protective cover, a glass plate, and a plastic plate having a surface subjected to a treatment for lowering water permeation coefficient, and the like can be used, and a method of pasting the cover to a device substrate with a thermosetting resin or photo-curable resin to attain sealing is suitably used. When a space is kept using a spacer, blemishing of a device can be prevented easily. If an inert gas such as nitrogen, argon and the like is filled in this space, oxidation of a cathode can be prevented, further, by placing a desiccant agent such as barium oxide and the like in this space, it becomes easy to suppress moisture adsorbed in a production process from imparting damage to a device. It is preferable to adopt at least one strategy among these methods.

The polymer LED of the present invention can be used as a sheet light source, segment display, dot matrix display, or back light of a liquid crystal display.

For obtaining light emission in the form of sheet using a polymer LED of the present invention, it may be advantages to place a sheet anode and a sheet cathode so as to overlap. For obtaining light emission in the form of pattern, there are a method in which a mask having a window in the form of pattern is placed on the surface of the above-mentioned sheet light emitting diode, a method in which an organic substance layer in non-light emitting parts is formed with extremely large thickness to give substantially no light emission, and a method in which either an anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be advantageous that both an anode and a cathode are formed in the form of stripe, and placed so as to cross. By using a method in which several polymer fluorescent bodies showing different emission colors are painted separately or a method in which a color filter or a fluorescence conversion filter is used, partial color display and multi-color display are made possible. In the case of a dot matrix device, passive driving is possible, and active driving may be carried out by combining with TFT and the like. These displays can be used as a display of a computer, television, portable terminal, cellular telephone, car navigation, view finder of video camera, and the like.

Further, the above-mentioned sheet light emitting device is of self emitting thin type, and can be suitably used as a sheet light source for back light of a liquid crystal display, or as a sheet light source for illumination. If a flexible substrate is used, it can also be used as a curved light source or display.

Examples will be shown below for illustrate the present invention further in detail, but the present invention is not limited to them.

(Number Average Molecular Weight and Weight Average Molecular Weight)

Here, as the number average molecular weight and the weight average molecular weight, a number average molecular weight and a weight average molecular weight reduced by polystyrene were measured by GPC (manufactured by Shimadzu Corp., LC-10Avp). A polymer to be measured was dissolved in tetrahydrofuran so as to give a concentration of about from 0.5 wt %, and the solution was injected in an amount of 50 μL into GPC. Tetrahydrofuran was used as the mobile phase of GPC, and allowed to flow at a flow rate of 0.6 mL/min. In the column, two TSKgel Super HM-H (manufactured by Tosoh Corp.) and one TSKgel Super H2000 (manufactured by Tosoh Corp.) were connected serially. A differential refractive index detector (RID-10A: manufactured by Shimadzu Corp.) was used as a detector.

SYNTHESIS EXAMPLE 1

Synthesis of DBF

DBF could be synthesized by the following method described in JP-A No. 2004-59899.

Benzofuran was charged in a three-necked flask under an inert atmosphere, and stirred at room temperature to cause dissolution, then, heated up to 75° C. After temperature rising, a solution obtained by diluting bromine with acetic acid was dropped. After completion of dropping, the solution was stirred for 3 hours while maintaining the temperature, and allowed to cool. After confirmation of disappearance of raw materials by TLC, sodium thiosulfate water was added to stop the reaction, and the solution was stirred for 1 hour at room temperature. After stirring, filtration was carried out to filtrate the cake off, further, washing operations with sodium thiosulfate water and water were performed, then, the product was dried. The resultant coarse product was re-crystallized from hexane, to obtain compound A-1.

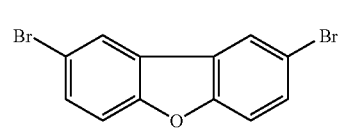

Compound A-1

Under an inert atmosphere, compound A-1 and tetrahydrofuran were charged in a four-necked flask, and cooled down to −78° C. n-butyllithium <1.6 mol/L hexane solution> was dropped, then, the mixture was stirred for 1 hour while maintaining the temperature. This reaction solution was dropped into a solution prepared by charging trimethoxyboronic acid and tetrahydrofuran in a four-necked flask and cooling them down to −78° C. After completion of dropping, the temperature was returned to room temperature slowly, and the mixture was stirred for 2 hours at room temperature. The reaction-complete mass was poured into a solution prepared by charging concentrated sulfuric acid and water in a beaker, thereby stopping the reaction. Toluene was added, the organic layer was extracted, further, water was added and the layer was washed. The solvent was distilled off, then, the residues and ethyl acetate were placed in a four-necked flask, subsequently, 30% hydrogen peroxide water was added, and the mixture was stirred for 2 hours at 40° C. This reaction solution was poured into an aqueous solution of ammonium iron (II) sulfate and water in a beaker. After stirring, the organic layer was extracted, and the organic layer was washed with water. The solvent was removed, to obtain compound A-2.

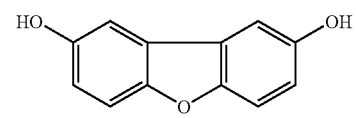

Compound A-2

Under an inert atmosphere, compound A-2 and N,N-dimethylformamide were charged in a four-necked flask, the mixture was stirred at room temperature to cause dissolution thereof, then, potassium carbonate was added and the temperature was raised up to 100° C. After temperature rising, a solution prepared by diluting n-octyl bromide with N,N-dimethylformamide was dropped. After completion of dropping, the temperature was raised up to 60° C., and the mixture was stirred for 2 hours while maintaining the temperature. Water was added to stop the reaction, subsequently, toluene was added, the organic layer was extracted, and the organic layer was washed with water twice. After drying over anhydrous sodium sulfate, the solvent was distilled off. The resultant coarse product was purified by silica gel column, to obtain compound A-3.

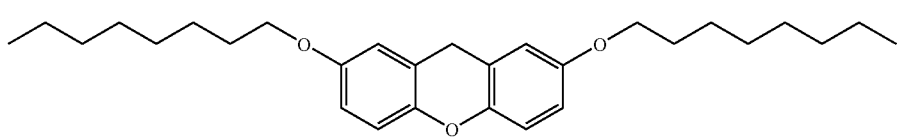

Compound A-3

Under an inert atmosphere, compound A-3 and N,N-dimethylformamide were charged in a four-necked flask, stirred at room temperature to cause dissolution thereof, then, cooled in an ice bath. After cooling, a solution prepared by diluting N-bromosuccinimide with N,N-dimethylformamide was dropped. After completion of dropping, the mixture was maintained for 1 hour in an ice bath and 18.5 hours at room temperature and heated up to 40° C., and stirred for 6.5 hours while maintaining the temperature. The solvent was removed, toluene was added to the residue to cause dissolution, and the organic layer was washed with water three times. After drying over anhydrous sodium sulfate, the solvent was distilled off. The resultant coarse product was purified by silica gel column and liquid chromatography preparative isolation, to obtain DBF.

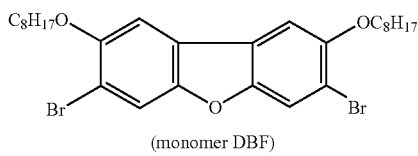

(monomer DBF)

SYNTHESIS EXAMPLE 2

Synthesis of POZ

POZ could be synthesized by the following method described in WO 2004/60907 pamphlet.

Palladium acetate, tri-o-tolylphosphine and toluene were charged in a three-necked round-bottomed flask, and stirred for 20 minutes at room temperature. Phenoxazine, 1-bromo-4-butylbenzene, sodium t-butoxide and toluene were added, and the mixture was heated in an oil bath and refluxed for 15 hours. After cooling, concentrated hydrochloric acid was added and the mixture was stirred for 1 hour, then, the solution was passed through a neutral alumina column. The column was washed with toluene, and the solvent was removed using a rotary evaporator, to obtain yellow solid. The solid was re-crystallized from toluene/methanol, to obtain N-(4-n-butylphenyl)phenoxazine.

N-(4-n-butylphenyl)phenoxazine and methylene chloride were charged in a three-necked round-bottomed flask, and kept in an ice bath. Into the mixed solution, a solution of N-bromosuccinimide in dimethylformamide was dropped. The reaction mixture was controlled to room temperature, and stirred for 2 hours. The reaction mixture was washed with 2 N hydrochloric acid three times, and passed through a neutral alumina column. The column was washed with toluene, and the solvent was removed using a rotary evaporator, to obtain yellow solid. The solid was re-crystallized three times using hexane, to obtain POZ.

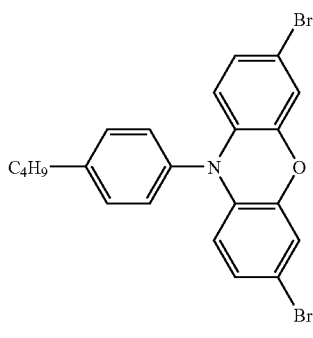

(monomer POZ)

EXAMPLE 1

Synthesis of Polymer Compound 1

0.79 g of DBF produced according to a method described in JP-A No. 2004-59899, 0.071 g of POZ produced according to a method described in WO 2004/60970 and 0.56 g of 2,2'-bipyridyl were charged in a reaction vessel, then, an atmosphere in the reaction system was purged with a nitrogen gas. To this was added 60 g of tetrahydrofuran (dehydrated solvent) deaerated previously by bubbling with an argon gas. Next, to this mixed solution, 1.0 g of bis(1,5-cyclooctadiene) nickel (0) was added, and the mixture was reacted for 4 hours at 60° C. The reaction was carried out in a nitrogen gas atmosphere.

After the reaction, this solution was cooled, then, a mixed solution of methanol 40 ml/ion exchanged water 40 ml was poured, and the mixture was stirred for about 1 hour. Next, the generated precipitate was recovered by filtration. Next, this precipitate was dried under reduced pressure, then, dissolved in toluene. This toluene solution was filtrated to remove insoluble substances, then, this toluene solution was purified by passing through a column filled with alumina. Next, this toluene solution was washed with a 1 N hydrochloric acid aqueous solution, and allowed to stand still to cause liquid partitioning, then, the toluene solution was recovered, and next, washed with ca. 5% ammonia water, and allowed to stand still to cause liquid partitioning, then, the toluene solution was recovered, and next, this toluene solution was washed with water, and allowed to stand still to cause liquid partitioning, then, the toluene solution was recovered. Next, this toluene solution was poured into methanol, and to generate a precipitate again.

Next, the generated precipitate was recovered, and this precipitate was dried under reduced pressure, to obtain 0.29 g of a polymer. This polymer is called polymer compound 1. The resultant polymer compound 1 had a polystyrene-reduced weight average molecular weight of $1.0 \times 10^5$ and a polystyrene-reduced number average molecular weight of $4.4 \times 10^4$.

EXAMPLE 2

Evaluation of Fluorescent Property of Polymer Compound

A 0.8 wt % toluene solution of polymer compound 1 was spin-coated on a quartz plate to form a thin film of the polymer compound. The fluorescent spectrum of this thin film was measured at an excited wavelength of 350 nm using a fluorescence spectrophotometer (Fluorolog manufactured by JOBINYVON-SPEX). For obtaining relative fluorescence intensity on the thin film, fluorescent spectrum plotted against wave number was integrated in the spectrum measuring range utilizing the intensity of Raman line of water as a standard, and measurement was performed using a spectrophotometer (Cary 5E, manufactured Varian), obtaining a value allocated to the absorbance at the excited wavelength.

Polymer compound 1 showed a fluorescent peak wavelength of 468 nm and a fluorescent intensity of 3.9.

COMPARATIVE EXAMPLE 1

Synthesis of Polymer Compound 2

0.46 g of 2,7-dibromo-9,9-dioctylfluorene, 0.10 g of 2,7-dibromo-9,9-diisopentylfluorene, 0.21 g of POZ and 0.56 g of 2,2'-bipyridyl were charged in a reaction vessel, then, an atmosphere in the reaction system was purged with a nitrogen gas. To this was added 60 g of tetrahydrofuran (dehydrated solvent) deaerated previously by bubbling with an argon gas. Next, to this mixed solution, 1.0 g of bis(1,5-cyclooctadiene) nickel (0) was added, and the mixture was reacted for 40 hours at room temperature. The reaction was carried out in a nitrogen gas atmosphere. After the reaction, a mixed solution of methanol 40 ml/ion exchanged water 40 ml was poured into this solution, and the mixture was stirred for about 1 hour. Next, the generated precipitate was recovered by filtration. Next, this precipitate was dried under reduced pressure, then, dissolved in toluene. This toluene solution was filtrated to remove insoluble substances, then, this toluene solution was purified by passing through a column filled with alumina. Next, this toluene solution was washed with a 1 N hydrochloric acid aqueous solution, and allowed to stand still to cause liquid partitioning, then, the toluene solution was recovered, and next, washed with ca. 5% ammonia water, and allowed to stand still to cause liquid partitioning, then, the toluene solution was recovered, and next, this toluene solution was washed with water, and allowed to stand still to cause liquid partitioning, then, the toluene solution was recovered. Next, this toluene solution was poured into methanol, and to generate a precipitate again. Next, the generated precipitate was recovered, and this precipitate was dried under reduced pressure, to obtain 0.30 g of a polymer. This polymer is called polymer compound 2. The resultant polymer compound 2 had a polystyrene-reduced weight average molecular weight of $9.4 \times 10^4$ and a polystyrene-reduced number average molecular weight of $2.5 \times 10^4$. Polymer compound 2 showed a fluorescent peak wavelength of 463 nm and a fluorescent intensity of 3.3.

EXAMPLE 3

Manufacturing of EL Device

On a glass substrate carrying an ITO film having a thickness of 150 nm formed thereon by a sputtering method, liquid obtained by filtrating a suspension of poly(3,4)ethylenedioxythiophene/polystyrenesulfonic acid (manufactured by Bayer, BaytronP AI4083) through a 0.2 μm membrane filter was spin-coated to form a thin film having a thickness of 70 nm, and dried on a hot plate at 200° C. for 10 minutes. Next, a solution obtained by dissolving polymer compound 1 in xylene at a concentration of 1.8 wt % was spin-coated at a rotational speed of 2400 rpm to form a film. The thickness after film formation was about 80 nm. Further, this was dried under reduced pressure at 80° C. for 1 hour, then, lithium fluoride was vapor-deposited at a thickness of about 4 nm, and calcium was vapor-deposited at a thickness of about 5 nm as a cathode, then, aluminum was vapor-deposited at a thickness of about 80 nm, to manufacture an EL device. After the degree of vacuum reached $1 \times 10^{-4}$ Pa or less, vapor deposition of a metal was initiated. By applying voltage on the resulting device, EL light emission having a peak at 480 nm was obtained from this device. This device showed initiation of light emission from 4.9 V.

COMPARATIVE EXAMPLE 2

Manufacturing of EL Device

On a glass substrate carrying an ITO film having a thickness of 150 nm formed thereon by a sputtering method, liquid obtained by filtrating a suspension of poly(3,4)ethylenedioxythiophene/polystyrenesulfonic acid (manufactured by Bayer, BaytronP AI4083) through a 0.2 μm membrane filter was spin-coated to form a thin film having a thickness of 70 nm, and dried on a hot plate at 200° C. for 10 minutes. Next, a solution obtained by dissolving polymer compound 2 in xylene at a concentration of 1.8 wt % was spin-coated at a rotational speed of 2200 rpm to form a film. The thickness after film formation was about 80 nm. Further, this was dried under reduced pressure at 80° C. for 1 hour, then, lithium fluoride was vapor-deposited at a thickness of about 4 nm, and calcium was vapor-deposited at a thickness of about 5 nm as a cathode, then, aluminum was vapor-deposited at a thickness of about 80 nm, to manufacture an EL device. After the degree of vacuum reached $1 \times 10^{-4}$ Pa or less, vapor deposition of a metal was initiated. By applying voltage on the resulting device, EL light emission having a peak at 470 nm was obtained from this device. This device showed initiation of light emission from 6.0 V.

SYNTHESIS EXAMPLE 3

Synthesis of Compound C (1) Synthesis of Compound C-1

7 g of 2,8-dibromodibenzothiophene and 280 ml of THF were charged in a 1 L four-necked flask under an inert atmosphere, and stirred at room temperature to cause dissolution thereof, then, cooled down to −78° C. 29 ml of n-butyllithium (1.6 mol hexane solution) was dropped. After completion of dropping, the mixture was stirred for 2 hours while maintaining the temperature, and 13 g of trimethoxyboronic acid was dropped. After completion of dropping, the temperature was returned to room temperature slowly. After stirred at room temperature for 3 hours, disappearance of raw materials was confirmed by TLC. 100 ml of 5 wt % sulfuric acid was added to stop the reaction, and the mixture was stirred at room temperature for 12 hours. Washing was performed with water added, to extract the organic layer. The solvent was substituted by ethyl acetate, then, 5 ml of 30 wt % hydrogen peroxide water was added and the mixture was stirred at 40° C. for 5 hours. Thereafter, the organic layer was extracted, and washed with a 10 wt % ammonium iron (II) sulfate aqueous solution, then, dried and the solvent was removed, to obtain 4.43 g of compound C-1 (brown solid) represented by the following formula:

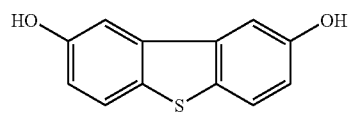

Compound C-1

It was found from LC-MS measurement results that by-products of a dimer and the like were also generated and the purity of compound C-1 was 77% (LC area percentage).

(2) Synthesis of compound C-2

4.43 g of compound C-1, 25.1 g of n-octyl bromide and 12.5 g (23.5 mmol) of potassium carbonate were charged in a 200 ml three-necked flask under an inert atmosphere, and 50 ml of methyl isobutyl ketone was added as a solvent and the mixture was refluxed under heat for 6 hours at 125° C. After completion of the reaction, the solvent was distilled off, and the organic layer was extracted by partitioning into chloroform and water, and further, washed with water twice. After drying over anhydrous sodium sulfate, purification was performed by a silica gel column (developing solvent: toluene/cyclohexane=1/10 (volume ratio)) to obtain 8.49 g (LC area percentage 97%, yield 94%) of compound C-2 represented by the following formula:

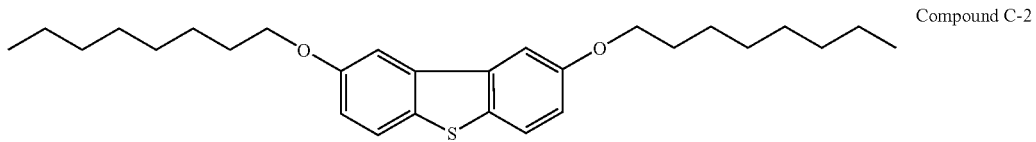
Compound C-2

(3) Synthesis of Compound C-3

6.67 g of compound C-2 and 40 ml of acetic acid were charged in a 100 ml three-necked flask, and heated up to a bath temperature of 140° C. in an oil bath. Then, 13 ml of 30 wt % hydrogen peroxide water was added through a cooling tube, and the mixture was stirred vigorously for 1 hour, then, the mixture was poured into 180 ml of cold water to terminate the reaction. After extraction with chloroform and drying, the solvent was removed to obtain 6.96 g (LC area percentage 90%, yield 97%) of compound C-3 represented by the following formula:

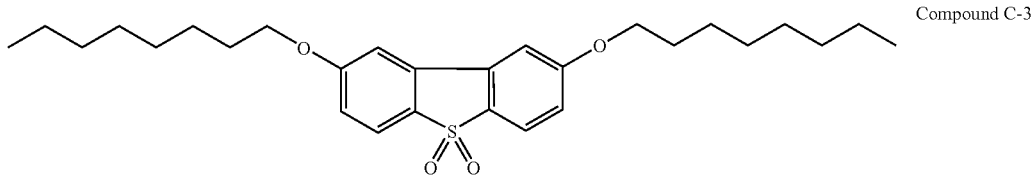
Compound C-3

(4) Synthesis of Compound C-4

3.96 g of compound C-3 and 15 ml of acetic acid/chloroform=1:1 (volume ratio) mixed liquid were charged in a 200 ml four-necked flask under an inert atmosphere, and the mixture was stirred at 70° C. to cause dissolution thereof. Next, a solution prepared by dissolving 6.02 g of bromine in 3 ml of the above-described solvent was added, and the resultant mixture was stirred for 3 hour. A sodium thiosulfate aqueous solution was added to remove unreacted bromine, and the reaction mixture was partitioned between chloroform and water, and the organic layer was extracted, and dried. Next, the solvent was removed, and purification was performed by a silica gel column (developing solvent: chloroform/hexane=1/4 (volume ratio)) to obtain 4.46 g (LC area percentage 98%, yield 84%) of compound C-4 represented by the following formula:

(5) Synthesis of Compound C 3.9 g of compound C-4 and 50 ml of diethyl ether were charged in a 200 ml three-necked flask under an inert atmosphere, and the mixture was heated up to 40° C. and stirred. 1.17 g lithium aluminum hydride was added portion-wise, and the mixture was reacted for 5 hours. Water was added gradually to cause decomposition of excess lithium aluminum hydride, and the mixture was washed with 5.7 ml of 36 wt % hydrochloric acid. The reaction mixture was partitioned between chloroform and water, and the organic layer was extracted, and dried. Purification was performed by a silica gel column (developing solvent: chloroform/hexane=1/5 (volume ratio)) to obtain 1.8 g (LC area percentage 99%, yield 49%) of compound C represented by the following formula:

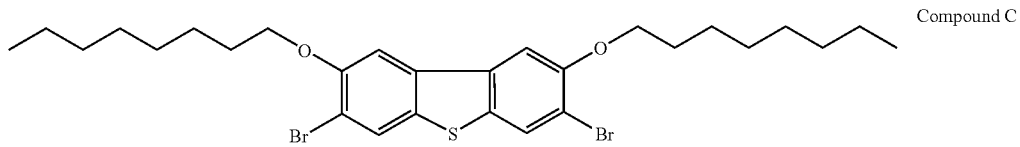
Compound C

SYNTHESIS EXAMPLE 4

Synthesis of 3,3'-dibromo-4,4'-dioctyloxybiphenyl)

(Synthesis of 4,4'-dioctyloxybiphenyl)

56 g of 4,4'-dihydroxybiphenyl was dissolved in 500 g ethanol. To this solution was added 40 g of potassium hydrox-

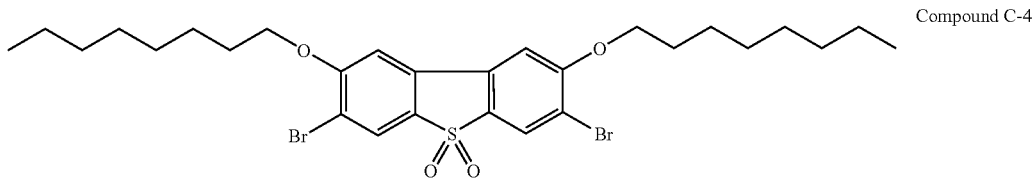
Compound C-4 ide, and the mixture was reacted. Next, this solution was heated, and 128 g of 1-bromooctane was dropped at 70° C., and subsequently, the mixture was reacted at 70° C. for 7 hours. The reaction was performed under a nitrogen atmosphere. After the reaction, this solution was cooled, and the generated precipitate was filtrated to recover. Next, this precipitate was washed with 500 ml of methanol, then, washed with a mixed solvent of methanol 500 ml/ion exchanged water 300 ml, and further, washed with a mixed solvent of acetone 500 ml/ion exchanged water 300 ml. This precipitate was dried under reduced pressure, to obtain 105 g of 4,4'-dioctyloxybiphenyl represented by the following structural formula:

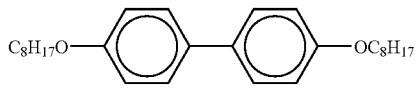

(Synthesis of 3,3'-dibromo-4,4'-dioctyloxybiphenyl)

20.5 g of 4,4'-dioctyloxybiphenyl was dissolved in 650 g of chloroform. To this solution, 16.8 g of bromine was dropped at a temperature of 30° C. or lower. After dropping, the mixture was reacted subsequently at room temperature for 45 hours. After the reaction, a sodium thiosulfate aqueous solution was added to the reaction solution, to treat unreacted bromine. Next, this solution was allowed to stand still, and partitioned, and a chloroform solution was recovered. This chloroform solution was washed with ion exchanged water three times, then, filtrated to remove insoluble substances. This solution was purified by passing through a column filled with alumina. Next, the solvent was distilled off under reduced pressure from this solution, to obtain a coarse product. This product was purified by re-crystallization from a mixed solvent of toluene 100 g/methanol 85 g. The resultant precipitate was dried under reduced pressure, to obtain 20 g of 3,3'-dibromo-4,4'-dioctyloxybiphenyl represented by the following structural formula:

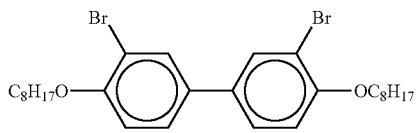

EXAMPLE 4

Synthesis of Polymer Compound 3

0.085 g of 3,3'-dibromo-4,4'-dioctyloxybiphenyl, 0.54 g of compound C, 0.21 g of POZ and 0.63 g of 2,2'-bipyridyl were charged into a reaction vessel, then, an atmosphere in the reaction system was purged with a nitrogen gas. To this was added 60 g of tetrahydrofuran (dehydrated solvent) deaerated previously by bubbling with an argon gas. Next, to this mixed solution, 1.11 g of bis(1,5-cyclooctadiene)nickel (0) was added, and the mixture was reacted for 21 hours at room temperature. The reaction was carried out in a nitrogen gas atmosphere.

After the reaction, a mixed solution of methanol 40 ml/ion exchanged water 40 ml was poured into this solution, and the mixture was stirred for about 1 hour. Next, the generated precipitate was recovered by filtration. Next, this precipitate was dried under reduced pressure, then, dissolved in toluene.

This toluene solution was filtrated to remove insoluble substances, then, this toluene solution was washed with a ca. 5% acetic acid aqueous solution, and allowed to stand still to cause liquid partitioning, then, the toluene solution was recovered. Next, this toluene solution was washed with 4% ammonia water, and allowed to stand still to cause liquid partitioning, then, the toluene solution was recovered. Next, this toluene solution was washed with ion exchanged water, and allowed to stand still to cause liquid partitioning, then, the toluene solution was recovered. Next, this toluene solution was purified by passing through a column filled with alumina. Next, this toluene solution was poured into methanol, to generate a precipitate again.

Next, the generated precipitate was recovered, and this precipitate was dried under reduced pressure, to obtain 0.19 g of a polymer. This polymer is called polymer compound 3. The resultant polymer compound 3 had a polystyrene-reduced weight average molecular weight of $1.0 \times 10^5$ and a polystyrene-reduced number average molecular weight of $1.3 \times 10^4$. Polymer compound 3 had a fluorescent peak wavelength of 473 nm and a fluorescent intensity of 6.8.

Structures of repeating units contained in polymer compound 3 estimated from the charged materials are as described below, and the molar ratio estimated from the charged materials is repeating units (3-A)/repeating unit (3-B)/repeating units (3-C)=6/3/1.

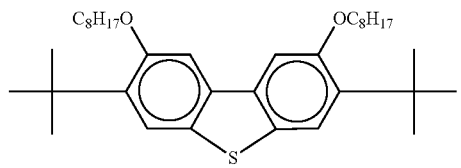

repeating unit (3-A)

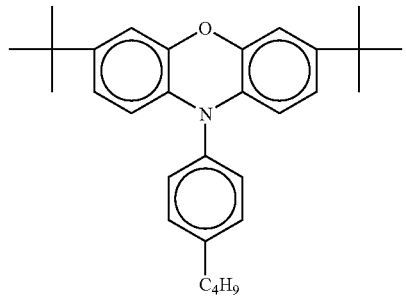

repeating unit (3-B)

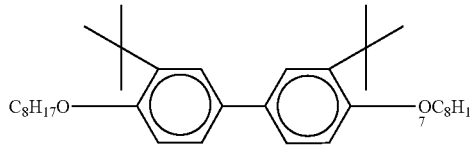

repeating unit (3-C)

SYNTHESIS EXAMPLE 5

Synthesis of Polymer Compound 4

1.38 g (1.8 mmol) of compound D, 1.60 g (3.0 mmol) of compound E and 23 ml of toluene were added to a 200 mL three-necked round-bottomed flask connected to a Dimroth condenser. Under a nitrogen atmosphere, the monomer solution was heated and at 50° C., 1.2 mg of palladium acetate, 9.5 mg of tris(2-methoxyphenyl)phosphine and 10.2 g of 20 wt % tetraethylammonium hydroxide aqueous solution were poured. After heating to 105° C., the mixture was stirred for 4 hours. Next, 267 mg of t-butylphenylboric acid dissolved in 1.5 mL of toluene was added and the mixture was stirred for 2 hours at 105° C. Further, 0.6 g of sodium N,N-diethylthiocarbamate trihydrate and 9 mL of ion exchanged water were added and the mixture was stirred for 2 hours at 65° C. The organic layer was separated from the aqueous layer, then, the organic layer was washed with about 70 mL of 2 M hydrochloric acid (once), about 70 mL of 10 wt % sodium acetate aqueous solution (once) and about 70 mL of ion exchanged water (three times) in this order. The organic layer was dropped into about 800 mL of methanol to cause precipitation of a polymer, and the precipitate was filtrated, then, dried to obtain solid. This solid was dissolved in about 90 mL of toluene, and the solution was passed through a silica gel/alumina column through which toluene had been passed previously, and this solution was dropped into about 800 mL of methanol to case precipitation of a polymer, and the precipitate was filtrated, then, dried to obtain polymer compound 4.

The resultant polymer compound 4 had a polystyrene-reduced weight average molecular weight of $3.0 \times 10^5$.

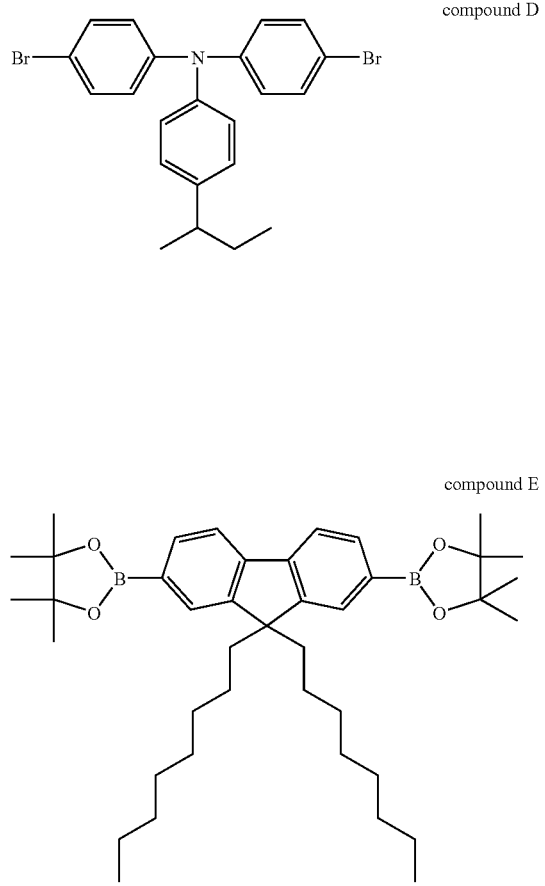

compound D compound E

Polymer compound 4 is estimated, based on the charged raw materials, to have repeating units of the following structural formulae at 1:1 (molar ratio).

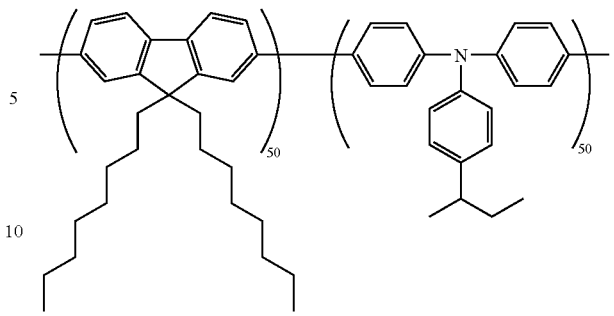

EXAMPLE 5

(Manufacturing of EL Device)

On a glass substrate carrying an ITO film having a thickness of 150 nm formed thereon by a sputtering method, liquid obtained by filtrating a suspension of poly(3,4)ethylenedioxythiophene/polystyrenesulfonic acid manufactured by Bayer, BaytronP AI4083) through a 0.2 μm membrane filter was spin-coated at a rotational speed of 3000 rpm to form a film. The thickness after film formation was about 60 nm. Thereafter, the film was dried on a hot plate at 200° C. for 10 minutes. Next, a solution prepared by dissolving polymer compound 4 in xylene at a concentration of 0.5 wt % was spin-coated to form a thin film having a thickness of 10 nm, and dried on a hot plate at 180° C. for 15 minutes. Next, a solution prepared by dissolving polymer compound 3 in xylene at a concentration of 1.8 wt % was spin-coated at a rotational speed of 2000 rpm to form a film. The thickness after film formation was about 65 nm. Further, this was dried under reduced pressure at 80° C. for 1 hour, then, as a cathode, barium was vapor-deposited at a thickness of about 5 nm, then, aluminum was vapor-deposited at a thickness of about 80 nm, producing an EL device. After the degree of vacuum reached $1 \times 10^{-4}$ Pa or less, vapor deposition of a metal was initiated. By applying voltage on the resulting device, EL light emission having a peak at 475 nm was obtained from this device. This device showed initiation of light emission from 4.2 V.

INDUSTRIAL APPLICABILITY

The copolymer of the present invention is useful as a light emitting material or charge transporting material, and excellent in device properties in the case of manufacturing of an electroluminescence device (polymer LED). Therefore, a polymer LED containing the copolymer of the present invention can be used for curved or flat light sources for backlight or illumination of liquid crystal displays, and for segment type displays, dot matrix flat display panels, and the like.

The invention claims:

1. A copolymer comprising a repeating unit of the following formula (1) and a repeating unit of the following formula (2):

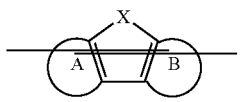
(1)

wherein, a ring A and ring B represent each independently an aromatic ring optionally having a substituent; X is —O—, —S—, —S(=O)—, —S(=O)$_2$—, —Si(R$_1$)$_2$—, —Si(R$_1$)$_2$—, —Si(R$_1$)$_2$—, —B(R$_1$)—, —P(R$_1$)—, —P(=O)(R$_1$)—, —O—C(R$_1$)$_2$— or —N=C(R$_1$)—, and R$_1$ represents a substituent; and when there are two or more R$_1$ in the same formula, they may be the same or different;

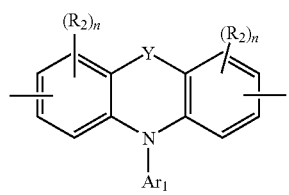
(2)

wherein, Y is —O—, —S— or —C(=O)—; Ar$_1$ represents an aryl group optionally having a substituent or a monovalent heterocyclic group optionally having a substituent, and there is no substituent connected to atoms of the ring of Ar$_1$, the atoms being adjacent an atom of Ar$_1$ connected to a nitrogen atom in the formula; R$_2$ represents a substituent, and n represents an integer of from 0 to 3; and when there are two or more R$_2$ in the formula, they may be the same or different.

2. The copolymer according to claim 1, wherein the formula (1) is represented by the following formula (1-1), (1-2) or (1-3):

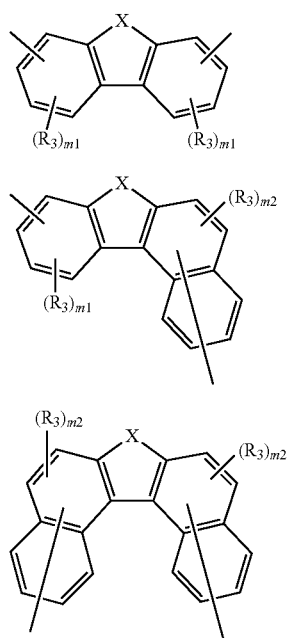

wherein, X represents the same meaning as described above, and R$_3$ represents a substituent; m1 represents an integer of from 0 to 3, and m2 represents an integer of from 0 to 5; and when there are two or more m1 and m2 in the same formula, they may be the same or different, respectively, and when there are two or more R$_3$ in the same formula, they may be the same or different.

3. The copolymer according to claim 1, wherein the formula (2) is represented by the following formula (2-1):

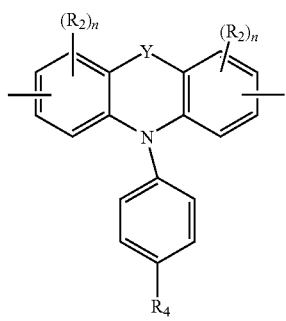
(2-1)

wherein, Y, R$_2$ and n represent the same meanings as described above, and R$_4$ represents a substituent.

4. The copolymer according to claim 1, further comprising a repeating unit of the following formula (3):

(3)

wherein, Ar$_2$ represents an arylene group, divalent heterocyclic group, divalent aromatic amine group or divalent group having a metal complex structure.

5. The copolymer according to claim 1, wherein the polystyrene-reduced number average molecular weight is $10^3$ to $10^8$.

6. The copolymer according to claim 1, wherein the polystyrene-reduced number average molecular weight is $3 \times 10^3$ to $10^8$.

7. A polymer composition comprising at least one material selected from hole transporting materials, electron transporting materials and light emitting materials, and the copolymer as described in claim 1.

8. A solution comprising the copolymer as described in claim 1 or the polymer composition comprising at least one material selected from hole transporting materials, electron transporting materials and light emitting materials, and the copolymer as described in claim 1, and a solvent.

9. A thin film comprising the copolymer as described in claim 1 or the polymer composition comprising at least one material selected from hole transporting materials, electron transporting materials and light emitting materials, and the copolymer as described in claim 1.

10. An organic transistor having the thin film as described in claim 9.

11. A polymer light emitting device having an organic layer between electrodes composed of an anode and a cathode wherein the organic layer contains the copolymer as described in claim 1 or the polymer composition comprising at least one material selected from hole transporting materials, electron transporting materials and light emitting materials, and the copolymer as described in claim 1.

12. The polymer light emitting device according to claim 11, wherein the organic layer is a light emitting layer.

13. The polymer light emitting device according to claim 12, wherein the light emitting layer contains further a hole transporting material, electron transporting material or light emitting material.

14. The polymer light emitting device according to claim 11, having a light emitting layer and a charge transporting layer between electrodes composed of an anode and a cathode wherein the charge transporting layer contains the copolymer as described in claim 1 or the polymer composition comprising at least one material selected from hole transporting materials, electron transporting materials and light emitting materials, and the copolymer as described in claim 1.

15. The polymer light emitting device according to claim 11, having a light emitting layer and a charge transporting layer between electrodes composed of an anode and a cathode and having a charge injection layer between the charge transporting layer and the electrode wherein the charge injection layer contains the copolymer as described in claim 1 or the polymer composition comprising at least one material selected from hole transporting materials, electron transporting materials and light emitting materials, and the copolymer as described in claim 1.

16. A sheet light source using the polymer light emitting device as described in claim 11.

17. A segment display using the polymer light emitting device as described in claim 11.

18. A dot matrix display using the polymer light emitting device as described in claim 11.

19. A liquid crystal display using the polymer light emitting device as described in claim 11 as back light.

\* \* \* \* \*